United States Patent
Mitobe et al.

(10) Patent No.: US 11,054,691 B2
(45) Date of Patent: Jul. 6, 2021

(54) POLARIZING PLATE, CIRCULARLY POLARIZING PLATE, AND DISPLAY DEVICE

(71) Applicant: FUJIFILM Corporation, Tokyo (JP)

(72) Inventors: Fumitake Mitobe, Kanagawa (JP); Jun Takeda, Kanagawa (JP); Naoya Nishimura, Kanagawa (JP); Yuzo Fujiki, Kanagawa (JP); Yumi Katou, Kanagawa (JP); Yasukazu Kuwayama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/940,794

(22) Filed: Jul. 28, 2020

(65) Prior Publication Data
US 2020/0355960 A1 Nov. 12, 2020

Related U.S. Application Data

(63) Continuation of application No. PCT/JP2019/003199, filed on Jan. 30, 2019.

(30) Foreign Application Priority Data

Jan. 30, 2018 (JP) .............................. JP2018-013499

(51) Int. Cl.
*G02F 1/1335* (2006.01)
*G02F 1/13363* (2006.01)

(52) U.S. Cl.
CPC .... *G02F 1/133528* (2013.01); *G02F 1/13363* (2013.01); *G02F 1/133541* (2021.01); *G02F 1/133638* (2021.01)

(58) Field of Classification Search
CPC ................................................ G02F 1/133528
See application file for complete search history.

(56) References Cited

U.S. PATENT DOCUMENTS

2010/0079687 A1* 4/2010 Furuta ............... G02F 1/133528
349/5
2011/0194052 A1* 8/2011 Hiratsuka ......... G02F 1/133528
349/96
(Continued)

FOREIGN PATENT DOCUMENTS

JP 09-127885 A 5/1997
JP 2011-164269 A 8/2011
(Continued)

OTHER PUBLICATIONS

Office Action, issued by the Japanese Patent Office dated Jan. 19, 2021, in connection with Japanese Patent Application No. 2019-569183.

(Continued)

*Primary Examiner* — Edmond C Lau
(74) *Attorney, Agent, or Firm* — Edwards Neils LLC; Jean C. Edwards, Esq.

(57) ABSTRACT

The present invention provides a polarizing plate including a polarizer having a high transmittance, which can be suitably applied to a circularly polarizing plate with which a significant decrease in an antireflection ability is suppressed in a case where the circularly polarizing plate is disposed on a display element; a circularly polarizing plate; and a display device. The polarizing plate includes a polarizer and an adjacent layer in contact with the polarizer, in which a transmittance in the absorption axis direction of the polarizer is 4.0% or more, and an in-plane average refractive index of the adjacent layer satisfies a relationship of Formula (X), Formula (X): Refractive index in a transmission axis direction of the polarizer<In-plane average refractive index of the adjacent layer<Refractive index in the absorption axis direction of the polarizer.

20 Claims, 3 Drawing Sheets

(56) References Cited

U.S. PATENT DOCUMENTS

2015/0103295 A1    4/2015  Hiratsuka et al.
2017/0102491 A1    4/2017  Lee

FOREIGN PATENT DOCUMENTS

| JP | 2011-164294 A  | 8/2011  |
| JP | 2013-228706 A  | 11/2013 |
| WO | 2015/122520 A1 | 8/2015  |
| WO | 2018/168351 A1 | 9/2018  |

OTHER PUBLICATIONS

International Search Report issued in PCT/JP2019/003199 dated Apr. 9, 2019.
Written Opinion issued in PCT/JP2019/003199 dated Apr. 9, 2019.
International Preliminary Report on Patentability completed by WIPO on Aug. 4, 2020 in connection with International Patent Application No. PCT/JP2019/003199.

* cited by examiner

POLARIZING PLATE, CIRCULARLY POLARIZING PLATE, AND DISPLAY DEVICE

CROSS-REFERENCE TO RELATED APPLICATIONS

This application is a Continuation of PCT International Application No. PCT/JP2019/003199 filed on Jan. 30, 2019, which was published under PCT Article 21(2) in Japanese, and which claims priority under 35 U.S.C. § 119(a) to Japanese Patent Application No. 2018-013499 filed on Jan. 30, 2018. The above applications are hereby expressly incorporated by reference, in their entirety, into the present application.

BACKGROUND OF THE INVENTION

1. Field of the Invention

The present invention relates to a polarizing plate, a circularly polarizing plate, and a display device.

2. Description of the Related Art

In a display device typified by an organic electroluminescent (EL) display device, a circularly polarizing plate in which a polarizer and λ/4 plate are laminated to prevent reflection of external light has been used (JP1997-127885A (JP-H09-127885A)).

SUMMARY OF THE INVENTION

In recent years, it has been required that a pattern (an image, a character, or the like) displayed on a display panel should be clearer with energy saving. As one of methods therefor, there is a method for increasing a transmittance of a polarizer in the above-mentioned circularly polarizing plate.

Typically, a polarizer having a high transmittance has a low degree of polarization, and therefore, in a case where a circularly polarizing plate including such a polarizer is used, the transmittance is anticipated to be improved, but an antireflection ability is expected to be decreased.

The polarizer having a high transmittance results in an increase in the transmittance in the absorption axis direction of the polarizer in many cases, and thus, the present inventors have found that in a case where a polarizer having a high transmittance in the absorption axis direction is used, an antireflection ability is unexpectedly decreased.

The present invention has been made from the viewpoint of the circumstances, and has an object to provide a polarizing plate including a polarizer having a high transmittance, which can be suitably applied to a circularly polarizing plate with which a significant decrease in an antireflection ability is suppressed in a case where the circularly polarizing plate is disposed on a display element.

In addition, the present invention has another object to provide a circularly polarizing plate and a display device.

The present inventors have conducted extensive studies from the viewpoint of the problems in the related art, and as a result, they have found that the problems can be solved by using a polarizing plate having a predetermined configuration.

That is, the present inventors have found that the problems can be solved by the following configuration.

(1) A polarizing plate comprising:
a polarizer; and
an adjacent layer in contact with the polarizer,
in which a transmittance in an absorption axis direction of the polarizer is 4.0% or more, and
an in-plane average refractive index of the adjacent layer satisfies a relationship of Formula (X) which will be described later.

(2) The polarizing plate as described in (1),
in which the polarizer is a polarizer formed using a dichroic substance.

(3) The polarizing plate as described in (1) or (2),
in which a difference between the refractive index in the absorption axis direction of the polarizer and the in-plane average refractive index of the adjacent layer is 0.15 or less, and
a difference between the in-plane average refractive index of the adjacent layer and the refractive index in the transmission axis direction of the polarizer is 0.10 or less.

(4) The polarizing plate as described in any one of (1) to (3),
in which an optical film thickness d, which is a product of the in-plane average refractive index of the adjacent layer and a thickness of the adjacent layer, satisfies a relationship of Formula (Y) which will be described later.

(5) The polarizing plate as described in any one of (1) to (4), further comprising an optical functional layer in contact with a surface of the adjacent layer opposite to the polarizer side,
in which an in-plane average refractive index of the optical functional layer is 1.49 to 1.60.

(6) The polarizing plate as described in any one of (1) to (5),
in which the in-plane average refractive index of the adjacent layer is lower than an in-plane average refractive index of the polarizer.

(7) The polarizing plate as described in any one of (1) to (6),
in which an average value of the transmittance in the absorption axis direction of the polarizer and the transmittance in the transmission axis direction of the polarizer is 47.0% or more.

(8) A circularly polarizing plate comprising:
the polarizing plate as described in any one of (1) to (7); and
a λ/4 plate,
in which the adjacent layer is disposed between the polarizer and the λ/4 plate.

(9) A display device comprising:
a display element; and
the circularly polarizing plate as described in (8) disposed on the display element.

(10) The display device as described in (9),
in which the display element is an organic electroluminescent display element.

According to the present invention, it is possible to provide a polarizing plate including a polarizer having a high transmittance, which can be suitably applied to a circularly polarizing plate with which an antireflection ability is suppressed from a significant decrease in a case where the circularly polarizing plate is disposed on a display element.

In addition, according to the present invention, it is possible to provide a circularly polarizing plate and a display device.

DESCRIPTION OF THE PREFERRED EMBODIMENTS

Figure 1:
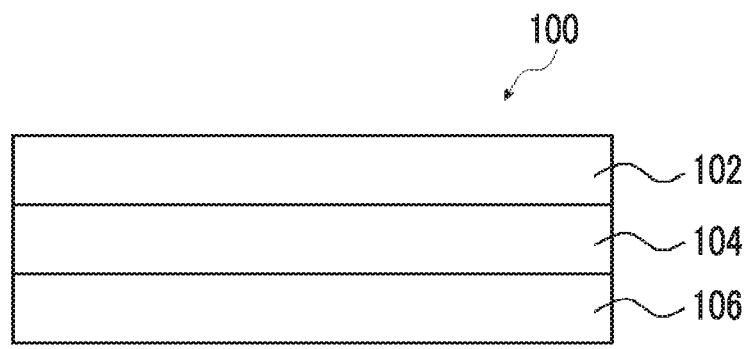
FIG. 1 is a cross-sectional view of a display device including a circularly polarizing plate for describing the problems of the related art.

Hereinafter, the present invention will be described in detail. Furthermore, in the present specification, a numerical range expressed using "to" is used in a meaning of a range that includes the preceding and succeeding numerical values of "to" as the lower limit value and the upper limit value, respectively. First, terms used in the present specification will be described.

In the present invention, Re(λ) and Rth(λ) represent an in-plane retardation and a thickness direction retardation at a wavelength of λ, respectively. Unless otherwise specified, the wavelength of λ is defined as 550 nm.

In the present invention, Re(λ) and Rth(λ) are values measured at a wavelength of X in AxoScan OPMF-1 (manufactured by Opto Science, Inc.). By inputting an average refractive index ((nx+ny+nz)/3) and a film thickness (d (μm)) to AxoScan, it is possible to calculate:

Slow axis direction (°)

$Re(λ)=R0(λ)$ $Rth(λ)=((nx+ny)/2-nz)×d.$

In addition, R0(λ) is expressed in a numerical value calculated with AxoScan OPMF-1, but means Re(λ).

The average refractive index used in AxoScan is measured using an Abbe refractometer (NAR-4T, manufactured by Atago Co., Ltd.) and using a sodium lamp (λ=589 nm) as a light source. In addition, in a case where wavelength dependency is measured, the wavelength dependency can be measured with a multi-wavelength Abbe refractometer DR-M2 (manufactured by Atago Co., Ltd.) in combination with an interference filter.

In addition, the values mentioned in Polymer Handbook (JOHN WILEY & SONS, INC.) and the catalogues of various optical films can be used. The values of the average refractive indexes of major optical films are exemplified below: cellulose acylate (1.48), cycloolefin polymer (1.52), polycarbonate (1.59), polymethyl methacrylate (1.49), and polystyrene (1.59).

In the present specification, angles (for example, an angle of "90°" or the like) and a relationship thereof (for example, "orthogonal", "parallel", and "intersecting at 45°") include an error range accepted in the technical field to which the present invention belongs. For example, the angle means an angle in the range of the exact angle 10°, and the error from the exact angle is preferably 5° or less, and more preferably 3° or less.

In the present specification, the "absorption axis" of the polarizer means a direction in which the absorbance is highest. The "transmission axis" means a direction in which an angle of 90° is formed with respect to the "absorption axis".

The present inventors have found that in a case where a circularly polarizing plate including a polarizer having a high transmittance in the absorption axis direction is used, an antireflection ability is unexpectedly decreased. A reason therefor will be described with reference to FIG. 1.

In a display device 100 shown in FIG. 1, a polarizer 102 having a transmittance in the absorption axis direction of 4.0% or more, λ/4 plate 104, and a display element 106 are laminated. The polarizer 102 and the λ/4 plate 104 function as a circularly polarizing plate and prevent external light reflection.

On the other hand, since the polarizer 102 has a high transmittance in the absorption axis direction, the amount of light which transmits the polarizer 102 and reaches the surface of the λ/4 plate 104 is increased. Therefore, the amount of light reflected at an interface between the polarizer 102 and the λ/4 plate 104 is increased, and as a result, the antireflection ability is unexpectedly significantly decreased.

In contrast, in the present invention, an interfacial reflection of light transmitted through a polarizer can be suppressed by providing an adjacent layer exhibiting an in-plane average refractive index which is smaller than the refractive index in the absorption axis direction of the polarizer and larger than the refractive index in the transmission axis direction so as to be in contact with the polarizer. That is, the reflection at an interface between the polarizer and the λ/4 plate as described above can be suppressed, and as a result, a significant decrease in the antireflection ability can be suppressed.

First Embodiment

Hereinafter, first embodiments of each of the polarizing plate, the circularly polarizing plate, and the display device of the present invention will be described with reference to drawings.

Figure 2:
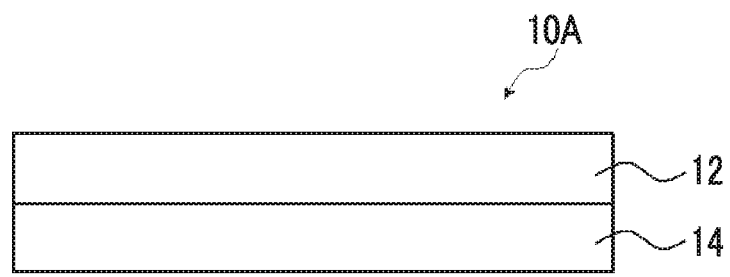
FIG. 2 is a cross-sectional view of a first embodiment of a polarizing plate.
Figure 3:
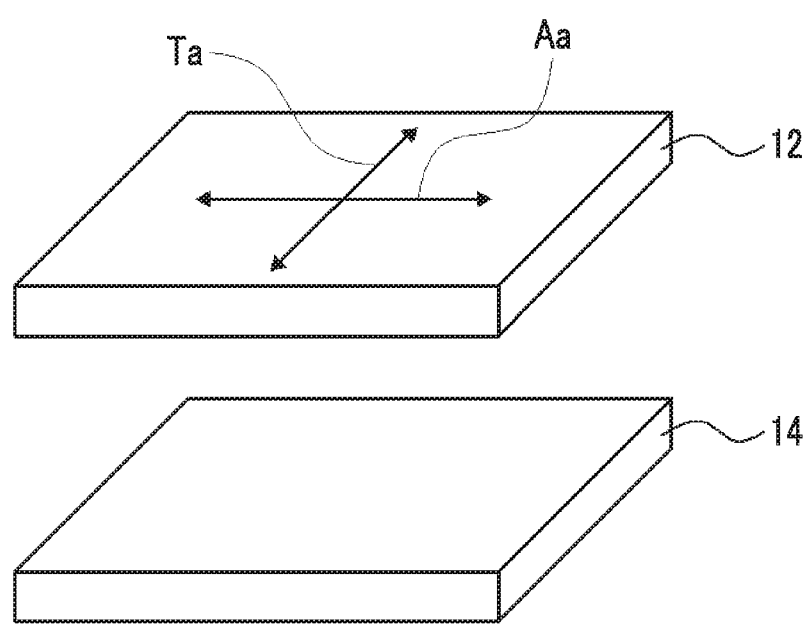
FIG. 3 is a view for describing the absorption axis direction and the transmission axis direction of a polarizer in a polarizing plate.

FIG. 2 shows the first embodiment of the polarizing plate of the present invention. A polarizing plate 10A shown in FIG. 2 includes a polarizer 12 and an adjacent layer 14 disposed so as to be in contact with the surface of the polarizer 12. FIG. 3 shows the directions of the absorption axis Aa and the transmission axis Ta of the polarizer 12.

Hereinafter, each of members will be described.

<Polarizer>

The polarizer is a member (linear polarizer) having a function of converting light into specific linearly polarized light, and examples thereof include an absorption type polarizer.

The transmittance in the absorption axis direction of the polarizer is 4.0% or more. Above all, the transmittance in the absorption axis direction of the polarizer is preferably 6.0% or more from the viewpoint that a pattern (an image, a character, and the like) of a display element can be more clearly visually recognized with energy saving. The upper limit value of the transmittance in the absorption axis direction of the polarizer is not particularly limited, but is preferably 50.0% or less, and more preferably 20.0% or less, from the viewpoint of the antireflection ability of a circularly polarizing plate including a polarizing plate.

An average value of the transmittance in the absorption axis direction and the transmittance in the transmission axis direction of the polarizer {(the transmittance in the absorption axis direction of the polarizer+the transmittance in the transmission axis direction of the polarizer)/2} is preferably 47.0.% or more, more preferably 48.0% or more, and still more preferably 49.0% or more. An upper limit value of the average value is not particularly limited, but is preferably 75.0% or less, and more preferably 60.0% or less, from the viewpoint of the antireflection ability of a circularly polarizing plate including the polarizing plate.

Measurement of the transmittance in the absorption axis direction and the transmittance in the transmission axis direction of the polarizer will be described in detail in Examples below, but is carried out using a multi-channel spectrometer (manufactured by OCEAN OPTICS, trade name "QE65000"), and the transmittance in the absorption axis direction and the transmittance in the transmission axis direction of the polarizer both correspond to an average transmittance in the wavelength range of 400 to 700 nm. More specifically, the average transmittance is calculated by weighted-averaging the values of the transmittance obtained by the measurement at every 10 nm between 400 and 700 nm, using a Y value of a color matching function (CIE1931, a color matching function of a standard observer's color matching function, or the like) such as XYZ standardized by the International Commission on Illumination (CIE). That is, a calculated value A which is a product of the transmittance value measured at every 10 nm between 400 and 700 nm and the Y value corresponding to the measurement wavelength of the transmittance is calculated for every measurement wavelength, the calculated values A obtained at each measurement wavelength are summed to calculate a total value B, and further, the obtained total value B is divided by a total value C of the Y values used above (the total value B/the total value C) to calculate a transmittance.

The refractive index in the absorption axis direction of the polarizer is intended to mean a refractive index along the absorption axis direction Aa in FIG. 3, and a value thereof is not particularly limited, but is preferably 1.55 to 2.00, and more preferably 1.55 to 1.85, from the viewpoint that the antireflection ability in a display device using a circularly polarizing plate including the polarizing plate of the embodiment of the present invention is more excellent (hereinafter also simply referred to that "the effects of the present invention are more excellent").

The refractive index in the transmission axis direction of the polarizer is intended to mean a refractive index along the transmission axis direction Ta in FIG. 3, and a value thereof is not particularly limited, but is preferably 1.50 to 1.90, and more preferably 1.50 to 1.75, from the viewpoint that the effects of the present invention are more excellent.

The refractive index is intended to mean a refractive index at a wavelength of 550 nm.

With regard to a method for measuring the refractive index, a polarizer is manufactured on a quartz glass plate and the refractive index of the polarizer is measured with a spectroscopic ellipsometer M-2000U manufactured by Woollam Co. Ltd., as described in detail in the section of Examples below.

A thickness of the polarizer is not particularly limited, but is preferably 0.1 to 5.0 μm, and more preferably 0.1 to 1.5 m, from the viewpoint of reducing the thickness.

Examples of the polarizer include a polarizer formed using a dichroic substance, an iodine-based polarizer, and a polyene-based polarizer, and the polarizer formed using a dichroic substance is preferable from the viewpoint that the transmittance of the polarizer is easily adjusted. Examples of the polarizer formed using a dichroic substance include a polarizer formed using a composition including a dichroic substance, and a polarizer formed using a liquid crystalline composition including a dichroic substance and a liquid crystalline compound as described below is preferable.

In the present specification, the dichroic substance refers to a colorant having an absorbance varying depending on a direction, and examples thereof include a diazo-based compound, a quinone-based compound, and other known dichroic substances. Incidentally, in the present specification, iodine ions (for example, $I^{3-}$ and $I^{5-}$) are not included in the dichroic substance.

As the dichroic substance, a compound represented by Formula (1) (hereinafter also abbreviated as "a specific dichroic substance") is preferable.

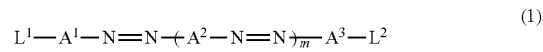

$$L^1-A^1-N=N-(A^2-N=N)_{\overline{m}}-A^3-L^2 \qquad (1)$$

In Formula (1), $A^1$, $A^2$, and $A^3$ each independently represent a divalent aromatic group which may have a substituent.

Furthermore, in Formula (1), $L^1$ and $L^2$ each independently represent a substituent.

In addition, in Formula (1), m represents an integer of 1 to 4, and in a case where m is an integer of 2 to 4, a plurality of $A^2$'s may be the same as or different from each other. In addition, m is preferably 1 or 2.

In Formula (1), the "divalent aromatic group which may have a substituent" represented by each of $A^1$, $A^2$, and $A^3$ will be described.

Examples of the substituent include the substituent group G described in paragraphs [0237] to [0240] of JP2011-237513A, among which a halogen atom, an alkyl group, an alkoxy group, an alkoxycarbonyl group (for example, methoxycarbonyl and ethoxycarbonyl) or an aryloxycarbonyl group (for example, phenoxycarbonyl, 4-methylphenoxycarbonyl, and 4-methoxyphenylcarbonyl) is preferable, the alkyl group is more preferable, and an alkyl group having 1 to 5 carbon atoms is still more preferable.

Examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among those, the phenylene group is preferable.

Furthermore, as the divalent aromatic heterocyclic group, a monocyclic or bicyclic heterocycle-derived group is preferable. Examples of an atom constituting the aromatic heterocyclic group, other than a carbon atom, include a nitrogen atom, a sulfur atom, and an oxygen atom. In a case where the aromatic heterocyclic group has a plurality of atoms constituting a ring other than the carbon atom, these may be the same as or different from each other. Specific examples of the aromatic heterocyclic group include a pyridylene group (pyridine-diyl group), a quinolylene group (quinoline-diyl group), an isoquinolylene group (isoquinoline-diyl group), a benzothiadiazolediyl group, a phthalimidediyl group, and a thienothiazolediyl group (hereinafter abbreviated as a "thienothiazole group").

Among the divalent aromatic groups, the divalent aromatic hydrocarbon group is preferable.

Here, it is preferable that any one of $A^1$, $A^2$, or $A^3$ is a divalent thienothiazole group which may have a substituent. Further, specific examples of the substituent of the divalent thienothiazole group include the same ones as those of the substituent in the above-mentioned "divalent aromatic group which may have a substituent", and preferred aspects thereof are also the same.

Furthermore, it is more preferable that $A^2$ out of $A^1$, $A^2$, and $A^3$ is a divalent thienothiazole group. In this case, $A^1$ and $A^3$ each represent a divalent aromatic group which may have a substituent.

In a case where $A^2$ is a divalent thienothiazole group, it is preferable that at least one of $A^1$ or $A^3$ is a divalent aromatic hydrocarbon group which may have a substituent, and it is more preferable that both $A^1$ and $A^3$ are divalent aromatic hydrocarbon groups which may have a substituent.

In Formula (1), the "substituent" represented by each of $L^1$ and $L^2$ will be described.

As the substituent, a group introduced to enhance solubility or nematic liquid crystallinity, a group having an electron-donating property or an electron-withdrawing property introduced to adjust the color tone of a colorant, or a group having a crosslinkable group (polymerizable group) to be introduced to fix alignment is preferable.

Examples of the substituent include an alkyl group (preferably an alkyl group having 1 to 20 carbon atoms, more preferably an alkyl group having 1 to 12 carbon atoms, and still more preferably an alkyl group having 1 to 8 carbon atoms, such as a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and still more preferably an alkenyl group having 2 to 8 carbon atoms, such as a vinyl group, an allyl group, a 2-butenyl group, and a 3-pentenyl group), an alkynyl group (preferably an alkynyl group having 2 to 20 carbon atoms, more preferably an alkynyl group having 2 to 12 carbon atoms, and still more preferably an alkynyl group having 2 to 8 carbon atoms, such as a propargyl group and a 3-pentynyl group), an aryl group (preferably an aryl group having 6 to 30 carbon atoms, more preferably an aryl group having 6 to 20 carbon atoms, and still more preferably an aryl group having 6 to 12 carbon atoms, such as a phenyl group, a 2,6-diethylphenyl group, a 3,5-ditrifluoromethylphenyl group, a styryl group, a naphthyl group, and a biphenyl group), a substituted or unsubstituted amino group (preferably a substituted or unsubstituted amino group having 0 to 20 carbon atoms, more preferably a substituted or unsubstituted amino group having 0 to 10 carbon atoms, and still more preferably a substituted or unsubstituted amino group having 0 to 6 carbon atoms, such as an unsubstituted amino group, a methylamino group, a dimethylamino group, a diethylamino group, and an anilino group), an alkoxy group (preferably an alkoxy group having 1 to 20 carbon atoms, and more preferably an alkoxy group having 1 to 15 carbon atoms, such as a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and still more preferably an oxycarbonyl group having 2 to 10 carbon atoms, such as a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and still more preferably an acyloxy group having 2 to 6 carbon atoms, such as an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and still more preferably an acylamino group having 2 to 6 carbon atoms, such as an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and still more preferably an alkoxycarbonylamino group having 2 to 6 carbon atoms, such as a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and still more preferably an aryloxycarbonylamino group having 7 to 12 carbon atoms, such as a phenyloxycarbonylamino group), a sulfonylamino group (preferably a sulfonylamino group having 1 to 20 carbon atoms, more preferably a sulfonylamino group having 1 to 10 carbon atoms, and still more preferably a sulfonylamino group having 1 to 6 carbon atoms, such as a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and still more preferably a sulfamoyl group having 0 to 6 carbon atoms, such as a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and still more preferably a carbamoyl group having 1 to 6 carbon atoms, such as an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and still more preferably an alkylthio group having 1 to 6 carbon atoms, such as a methylthio group and an ethylthio group), an arylthio group (preferably an arylthio group having 6 to 20 carbon atoms, more preferably an arylthio group having 6 to 16 carbon atoms, and still more preferably an arylthio group having 6 to 12 carbon atoms, such as a phenylthio group), a sulfonyl group (preferably a sulfonyl group having 1 to 20 carbon atoms, more preferably a sulfonyl group having 1 to 10 carbon atoms, and still more preferably a sulfonyl group having 1 to 6 carbon atoms, such as a mesyl group and a tosyl group), a sulfinyl group (preferably a sulfinyl group having 1 to 20 carbon atoms, more preferably a sulfinyl group having 1 to 10 carbon atoms, and still more preferably a sulfinyl group having 1 to 6 carbon atoms, such as a methanesulfinyl group and a benzenesulfinyl group), a ureido group (preferably a ureido group having 1 to 20 carbon atoms, more preferably a ureido group having 1 to 10 carbon atoms, and still more preferably a ureido group having 1 to 6 carbon atoms, such as an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and still more preferably a phosphoric acid amide group having 1 to 6 carbon atoms, such as a diethylphosphoramide group and a phenylphosphoramide group), a hydroxyl group, a mercapto group, a halogen atom (for example, a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms, and more preferably a heterocyclic group having 1 to 12 carbon atoms, such as a heterocyclic group having a heteroatom such as a nitrogen atom, an oxygen atom, and a sulfur atom, such as an epoxy group, an oxetanyl group, an imidazolyl group, a pyridyl group, a quinolyl group, a furyl group, a piperidyl group, a morpholino group, a benzoxazolyl group, a benzimidazolyl group, and a benzthiazolyl group), and a silyl group (preferably a silyl group having 3 to 40 carbon atoms, more preferably a silyl group having 3 to 30 carbon atoms, and still more preferably a silyl group having 3 to 24 carbon atoms, such as a trimethylsilyl group and a triphenylsilyl group).

These substituents may further be substituted with these substituents. In addition, in a case where two or more of the substituents are contained, the substituents may be the same as or different from each other. Further, if possible, the substituents may be bonded to each other to form a ring.

The substituent represented by each of $L^1$ and $L^2$ is preferably an alkyl group which may have a substituent, an alkenyl group which may have a substituent, an alkynyl group which may have a substituent, an aryl group which may have a substituent, an alkoxy group which may have a substituent, an oxycarbonyl group which may have a substituent, an acyloxy group which may have a substituent, an acylamino group which may have a substituent, an amino group which may have a substituent, an alkoxycarbonylamino group which may have a substituent, a sulfonylamino group which may have a substituent, a sulfamoyl group which may have a substituent, a carbamoyl group which may have a substituent, an alkylthio group which may have a substituent, a sulfonyl group which may have a substituent, a ureido group which may have a substituent, a nitro group, a hydroxyl group, a cyano group, an imino group, an azo group, a halogen atom, or a heterocyclic group; and more preferably the alkyl group which may have a substituent, the alkenyl group which may have a substituent, the aryl group which may have a substituent, the alkoxy group which may have a substituent, the oxycarbonyl group which may have a substituent, the acyloxy group which may have a substituent, the amino group which may have a substituent, the nitro group, the imino group, or the azo group.

It is preferable that at least one of $L^1$ or $L^2$ includes a crosslinkable group (polymerizable group), and it is more preferable that both of $L^1$ and $L^2$ include a crosslinkable group.

Specific examples of the crosslinkable group include the polymerizable groups described in paragraphs [0040] to [0050] of JP2010-244038A, and from the viewpoint of reactivity and synthesis suitability, an acryloyl group, a methacryloyl group, an epoxy group, an oxetanyl group, or a styryl group is preferable, and the acryloyl group or the methacryloyl group is more preferable.

Suitable aspects of $L^1$ and $L^2$ include an alkyl group substituted with the crosslinkable group, a dialkylamino group substituted with the crosslinkable group, and an alkoxy group substituted with the crosslinkable group.

The specific dichroic substance is preferably a compound represented by Formula (2).

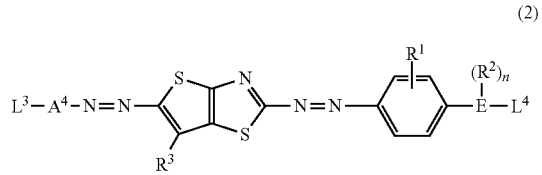

(2)

Here, in Formula (2), $A^4$ represents a divalent aromatic group which may have a substituent.

Furthermore, in Formula (2), $L^3$ and $L^4$ each independently represent a substituent.

Moreover, in Formula (2), E represents any one of a nitrogen atom, an oxygen atom, or a sulfur atom.

In addition, in Formula (2), $R^1$ represents a hydrogen atom, a halogen atom, an alkyl group which may have a substituent, or an alkoxy group which may have a substituent.

Furthermore, in Formula (2), $R^2$ represents a hydrogen atom or an alkyl group which may have a substituent.

Moreover, in Formula (2), $R^3$ represents a hydrogen atom or a substituent.

In addition, in Formula (2), n represents 0 or 1. It should be noted that in a case where E is a nitrogen atom, n is 1, and in a case where E is an oxygen atom or a sulfur atom, n is 0.

In Formula (2), specific examples and suitable aspects of the "divalent aromatic group which may have a substituent" represented by $A^4$ include the same ones as those of the "divalent aromatic group which may have a substituent" represented by each of $A^1$ to $A^3$ in Formula (1).

A preferred aspect of $A^4$ is a phenylene group.

Specific examples and suitable aspects of the "substituent" represented by each of L and $L^4$ in Formula (2) include the same ones as those of the "substituent" represented by each of $L^1$ and $L^2$ in Formula (1).

A suitable aspect of each of $L^3$ and $L^4$ is that at least one of $L^3$ or $L^4$ includes a crosslinkable group, and a more suitable aspect is that both $L^3$ and $L^4$ include a crosslinkable group.

In addition, a suitable aspect of the crosslinkable group of each of $L^3$ and $L^4$ is an acryloyl group or a methacryloyl group.

In Formula (2), E represents any one of a nitrogen atom, an oxygen atom, or a sulfur atom, and from the viewpoint of synthesis suitability. E is preferably the nitrogen atom.

In addition, from the viewpoint that it becomes easy to make the specific dichroic substance have an absorption on a short wavelength side (for example, a substance having a maximum absorption wavelength in the vicinity of 500 to 530 nm), it is preferable that E in Formula (2) is an oxygen atom.

On the other hand, from the viewpoint that it becomes easy to make the specific dichroic substance have an absorption on the long wavelength side (for example, a substance having a maximum absorption wavelength in the vicinity of 600 nm), it is preferable that E in Formula (2) is the nitrogen atom.

In Formula (2), $R^1$ represents a hydrogen atom, a halogen atom, an alkyl group which may have a substituent, or an alkoxy group which may have a substituent, and is preferably the hydrogen atom or the alkyl group which may have a substituent is preferable.

Next, the "alkyl group which may have a substituent" and the "alkoxy group which may have a substituent" represented by $R^1$ will be described.

Examples of the substituent include a halogen atom.

Examples of the alkyl group include a linear, branched, or cyclic alkyl group having 1 to 8 carbon atoms. Among those, a linear alkyl group having 1 to 6 carbon atoms is preferable, a linear alkyl group having 1 to 3 carbon atoms is more preferable, and a methyl group or an ethyl group is still more preferable.

Examples of the alkoxy group include an alkoxy group having 1 to 8 carbon atoms. Among those, an alkoxy group having 1 to 6 carbon atoms is preferable, an alkoxy group having 1 to 3 carbon atoms is more preferable, and a methoxy group or an ethoxy group is still more preferable.

In Formula (2), $R^2$ represents a hydrogen atom or an alkyl group which may have a substituent, and is preferably an alkyl group which may have a substituent.

Specific examples and suitable aspects of the "alkyl group which may have a substituent" represented by $R^2$ include the same ones as those of the above-mentioned "alkyl group which may have a substituent" in $R^1$ of Formula (2), and thus, a description thereof will be omitted.

In addition, in a case where E is a nitrogen atom, $R^2$ is a group which is present in Formula (2) (that is, it means a case where n=1). On the other hand, in a case where E is an oxygen atom or a sulfur atom, $R^2$ is a group which is not present in Formula (2) (that is, it means a case where n=0).

In Formula (2), $R^3$ represents a hydrogen atom or a substituent.

Specific examples and suitable aspects of the "substituent" represented by $R^3$ include the same ones as those of the above-mentioned "divalent aromatic group which may have a substituent", preferred aspects thereof are also the same, and thus, a description thereof will be omitted.

In Formula (2), n represents 0 or 1. It should be noted that in a case where E is a nitrogen atom, n is 1, and in a case where E is an oxygen atom or a sulfur atom, n is 0.

Specific examples of the specific dichroic substance represented by Formula (1) include the compounds described in paragraphs [0051] to [0081] of JP2010-152351A, the contents of which are incorporated herein by reference.

Among those, suitable examples of the specific dichroic substance having the structure represented by Formula (2) also include compounds (D-54) to (D-58) shown below, in addition to the compounds (D-1) to (D-53) described in paragraphs [0074] to [0081] of JP2010-152351A.

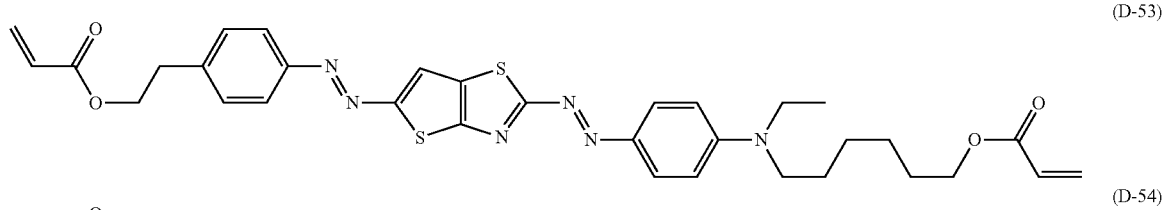

(D-53)

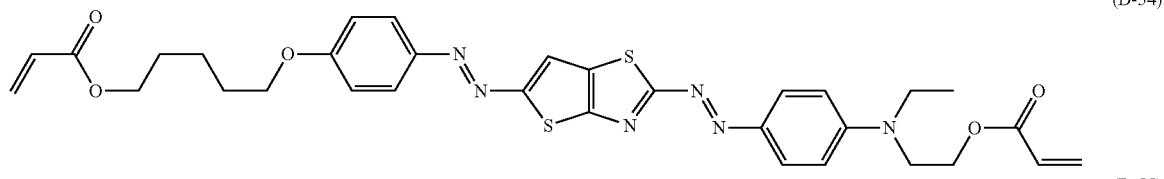

(D-54)

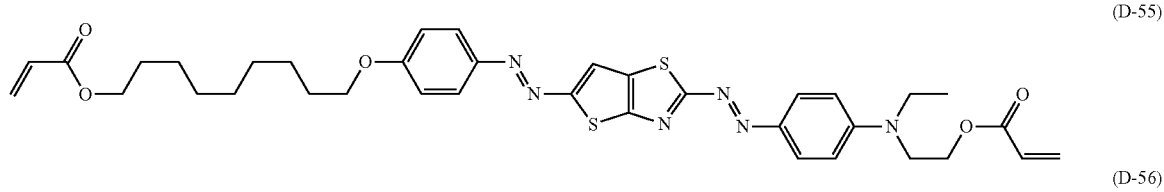

(D-55)

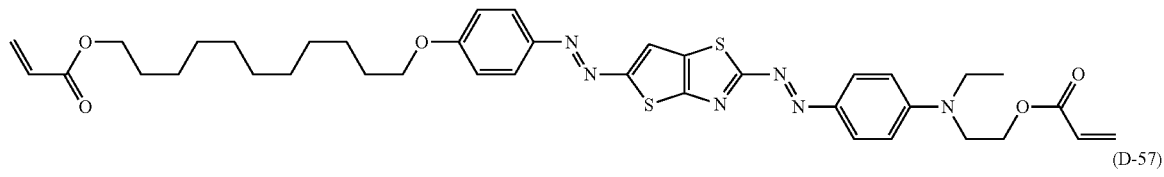

(D-56)

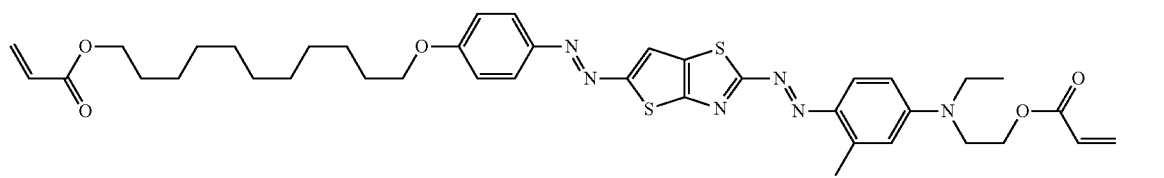

(D-57)

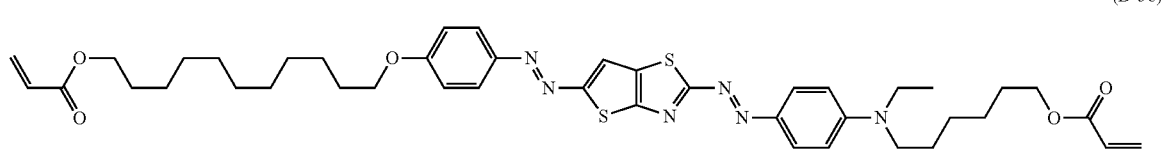

(D-58)

A content of the dichroic substance is preferably 25% by mass or less, and more preferably 15% by mass or less, with respect to a total mass of the polarizer. In addition, a lower limit value of the content of the dichroic substance is preferably 8% by mass or more, and more preferably 10% by mass or more, with respect to the total mass of the polarizer.

In the present invention, the polarizer is preferably a polarizer formed using a liquid crystalline composition including a liquid crystalline compound together with the above-mentioned dichroic substance for a reason that the dichroic substance can be aligned at a higher degree of alignment while restraining the dichroic substance from being precipitated.

Hereinafter, the components included in the liquid crystalline composition will be described in detail.

(Liquid Crystalline Compound)

As the liquid crystalline compound included in the liquid crystalline composition, both of a low-molecular liquid crystalline compound and a high-molecular liquid crystalline compound can be used.

Here, the "low-molecular liquid crystalline compound" refers to a liquid crystalline compound having no repeating unit in the chemical structure.

In addition, the "high-molecular liquid crystalline compound" refers to a liquid crystalline compound having a repeating unit in the chemical structure.

Examples of the low-molecular liquid crystalline compound include those described in JP2013-228706A.

Examples of the high-molecular liquid crystalline compound include the thermotropic liquid crystalline polymers described in JP2011-237513A. In addition, the high-molecular liquid crystalline compound may have a crosslinkable group (for example, an acryloyl group and a methacryloyl group) at a terminal.

(Interface Modifier)

The liquid crystalline composition preferably includes an interface modifier. By incorporation of the interface modifier, the smoothness of the surface of the coating film is improved, and an improvement of the degree of alignment and an improvement of the in-plane uniformity through suppression of cissing and unevenness are anticipated.

As the interface modifier, an interface modifier having a liquid crystalline compound placed horizontal on the surface of the coating film is preferable, and the compounds (horizontal alignment agents) described in paragraphs [0253] to [0293] of JP2011-237513A can be used.

In a case where the liquid crystalline composition includes the interface modifier, the content of the interface modifier is preferably 0.001 to 5 parts by mass, and more preferably 0.01 to 3 parts by mass, with respect to 100 parts by mass of the total amount of the dichroic substance and the liquid crystalline compound in the liquid crystalline composition.

(Polymerization Initiator)

The liquid crystalline composition may include a polymerization initiator.

A type of the polymerization initiator is not particularly limited, and examples thereof include a photopolymerization initiator and a thermal polymerization initiator, with the photopolymerization initiator being preferable. Further, the polymerization initiator may be either cationically polymerizable or radically polymerizable.

Examples of the photopolymerization initiator include α-carbonyl compounds (each of the specifications of U.S. Pat. Nos. 2,367,661A and 2,367,670A), acyloin ethers (the specification of U.S. Pat. No. 2,448,828A), aromatic acyloin compounds substituted with an α-hydrocarbon (the specification of U.S. Pat. No. 2,722,512A), polynuclear quinone compounds (each of the specifications of U.S. Pat. Nos. 3,046,127A and 2,951,758A), combinations of triarylimidazole dimers and p-aminophenyl ketones (the specification of U.S. Pat. No. 3,549,367A), acridine and phenazine compounds (JP1985-105667A (JP-S60-105667A) and the specification of U.S. Pat. No. 4,239,850A), oxadiazole compounds (the specification of U.S. Pat. No. 4,212,970A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

A commercially available product can also be used as such a photopolymerization initiator, and examples thereof include IRGACURE 184, IRGACURE 907, IRGACURE 369, IRGACURE 651, IRGACURE 819, and IRGACURE OXE-01, all manufactured by BASF.

In a case where the liquid crystalline composition includes a polymerization initiator, a content of the polymerization initiator is preferably 0.01 to 30 parts by mass, and more preferably 0.1 to 15 parts by mass with respect to 100 parts by mass of the total amount of the dichroic substance and the liquid crystalline compound in the liquid crystalline composition.

(Solvent)

The liquid crystalline composition preferably includes a solvent from the viewpoint of workability or the like.

Examples of the solvent include organic solvents such as ketones (for example, acetone, 2-butanone, methyl isobutyl ketone, cyclopentanone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, benzene, toluene, xylene, and trimethylbenzene), halogenated carbons (for example, dichloromethane, trichloromethane, dichloroethane, dichlorobenzene, and chlorotoluene), esters (for example, methyl acetate, ethyl acetate, and butyl acetate), alcohols (for example, ethanol, isopropanol, butanol, and cyclohexanol), cellosolves (for example, methyl cellosolve, ethyl cellosolve, and 1,2-dimethoxyethane), cellosolve acetates, sulfoxides (for example, dimethyl sulfoxide), amides (for example, dimethylformamide and dimethylacetamide), and heterocyclic compounds (for example, pyridine), and water. These solvents may be used alone or in combination of two or more kinds thereof.

Among these solvents, the organic solvents are preferably used, and the halogenated carbons or the ketones are more preferably used.

In a case where the liquid crystalline composition includes a solvent, a content of the solvent is preferably 80% to 99% by mass, and more preferably 83% to 97% by mass, with respect to a total mass of the liquid crystalline composition.

(Other Components)

The liquid crystalline composition may further include a dichroic substance other than the specific dichroic substance, and may include a plurality of the specific dichroic substances. In a case where a plurality of the dichroic substances are included, from the viewpoint of further curing the liquid crystalline composition, it is preferable to include a dichroic substance having a crosslinkable group which is crosslinked with the specific dichroic substance, and it is more preferable to include a plurality of the specific dichroic substances.

(Formation Method)

A method for forming a polarizer using the above-mentioned liquid crystalline composition is not particularly limited, and examples thereof include a method including a step of applying the liquid crystalline composition onto a transparent support to form a coating film (hereinafter also referred to as a "coating film forming step") and a step of aligning the liquid crystalline component included in the coating film in this order (hereinafter also referred to as an "aligning step").

Furthermore, the liquid crystalline component is a component including not only the above-mentioned liquid crystalline compound but also a liquid crystal dichroic substance in a case where the above-mentioned dichroic substance has liquid crystallinity.

The coating film forming step is a step of applying a liquid crystalline composition onto a transparent support to form a coating film.

Here, in the present specification, "transparent" indicates that the transmittance of visible light is 60% or more, preferably 80% or more, and more preferably 90% or more.

Examples of a material for forming the transparent support include polycarbonate-based polymers; polyester-based polymers such as polyethylene terephthalate (PET) and polyethylene naphthalate; acrylic polymers such as polymethyl methacrylate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as a nylon and an aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers, vinyl butyral-based polymers; arylate-based polymers; polyoxymethylene-based polymers; and epoxy-based polymers.

Furthermore, as the material for forming the transparent support, a thermoplastic norbornene-based resin is also preferable. Examples of the thermoplastic norbornene-based resin include ZEONEX and ZEONOR, both manufactured by Zeon Corporation, and ARTON manufactured by JSR Corporation.

In addition, as the material for forming the transparent support, a cellulosic polymer typified by triacetyl cellulose (TAC) is also preferable.

A thickness of the transparent support is not particularly limited, and is preferably 100 pun or less, more preferably 80 μm or less, and still more preferably 10 to 80 μm.

It becomes easy to apply a liquid crystalline composition onto the transparent support by using a liquid crystalline composition including the above-mentioned solvent or by using a liquid crystalline composition in the form of a liquid state material such as a melt solution by heating or the like.

Specific examples of a method for applying the liquid crystalline composition include known methods such as a roll coating method, a gravure printing method, a spin coating method, a wire bar coating method, an extrusion coating method, a direct gravure coating method, a reverse gravure coating method, a die coating method, a spray method, and an inkjet method.

In addition, in the present aspect, examples in which a liquid crystalline composition is applied onto a transparent support are shown, but are not limited thereto, and for example, the liquid crystalline composition may be applied onto an alignment film provided on the transparent support. Details of the alignment film will be described later.

The aligning step is a step of aligning the liquid crystalline components included in the coating film. By this step, a polarizer can be obtained.

The aligning step may include a drying treatment. By the drying treatment, components such as a solvent can be removed from the coating film. The drying treatment may be performed by a method of leaving the coating film at room temperature for a predetermined time (for example, natural drying), or may be performed by a method of heating and/or blowing.

Here, the liquid crystalline component included in the liquid crystalline composition may be aligned by the above-mentioned coating film forming step or drying treatment in some cases. For example, in an aspect in which the liquid crystalline composition is prepared as a coating liquid including a solvent, a coating film having light absorption anisotropy (that is, a polarizer) can be formed by drying the coating film and removing the solvent from the coating film.

In a case where the drying treatment is performed at a temperature no lower than the transition temperature of the liquid crystalline component included in the coating film to a liquid crystal phase, a heating treatment which will be described later may not be carried out.

The transition temperature of the liquid crystalline component included in the coating film to the liquid crystal phase is preferably 10° C. to 250° C., and more preferably 25° C. to 190° C., from the viewpoint of manufacturing suitability and the like. In a case where the transition temperature is 10° C. or higher, a cooling treatment or the like for lowering the temperature to a temperature range in which a liquid crystal phase is exhibited is not required, which is thus preferable. Further, in a case where the transition temperature is 250° C. or lower, a high temperature is not required even in a case where the liquid crystal phase is once brought into an isotropic liquid state at a higher temperature than the temperature range in which a liquid crystal phase is exhibited, which is thus preferable since waste of heat energy, and deformation, deterioration, or the like of a substrate can be reduced.

The aligning step preferably has a heating treatment. By the heating treatment, the liquid crystalline component included in the coating film can be aligned, and therefore, the coating film after the heating treatment can be suitably used as the polarizer.

The heating temperature is preferably performed at 10° C. to 250° C., and more preferably performed at 25° C. to 190° C., from the viewpoint of manufacturing suitability and the like. In addition, the heating time is preferably 1 to 300 seconds, and more preferably 1 to 90 seconds.

The aligning step may have a cooling treatment which is carried out after the heating treatment. The cooling treatment is a treatment for cooling the heated coating film to approximately room temperature (20° C. to 25° C.). By the cooling treatment, the alignment of the liquid crystalline component included in the coating film can be fixed. The cooling unit is not particularly limited, and can be carried out by a known method.

Through the above steps above, a polarizer can be obtained.

In addition, in the present aspect, examples of the method for aligning the liquid crystalline component included in the coating film include, but not limited to, the drying treatment, the heating treatment, and the like, and the method can be carried out by a known alignment treatment.

A method for producing the polarizer may have a step of curing the polarizer after the aligning step (hereinafter also referred to as a "curing step").

For example, in a case where the dichroic substance has a crosslinkable group (polymerizable group), the curing step is carried out by heating and/or light irradiation (exposure). Among those, the curing step is preferably carried out by light irradiation.

Various light sources such as infrared light, visible light, and ultraviolet rays can be used as a light source for curing, but the ultraviolet rays are preferable. Further, the ultraviolet rays may be irradiated while heating at the time of curing or the ultraviolet rays may be irradiated through a filter which transmits only a specific wavelength.

In a case where the exposure is performed while heating, the heating temperature at the time of exposure depends on the transition temperature of the liquid crystalline component included in the polarizer to the liquid crystal phase, but is preferably 25° C. to 140° C.

In addition, the exposure may be performed in a nitrogen atmosphere.

<Adjacent Layer>

The adjacent layer is a layer disposed so as to be in contact with the above-mentioned polarizer.

An in-plane average refractive index of the adjacent layer satisfies a relationship of Formula (X).

Refractive index in a transmission axis direction of the polarizer<In-plane average refractive index of the adjacent layer<Refractive index in the absorption axis direction of the polarizer    Formula (X)

In Formula (X), it is intended that the in-plane average refractive index of the adjacent layer is larger than the refractive index in the transmission axis direction of the polarizer and smaller than the refractive index in the absorption axis direction of the polarizer. In a case where the in-plane average refractive index of the adjacent layer satisfies the relationship of Formula (X), reflection of each of polarized light along the transmission axis direction of the polarizer, which transmits the polarizer and polarized light along the absorption axis direction of the polarizer, which transmits the polarizer, can be suppressed, and as a result, a remarkable decrease in the antireflection ability can be suppressed.

A difference between the refractive index in the absorption axis direction of the polarizer and the in-plane average refractive index of the adjacent layer (Refractive index in absorption axis direction of polarizer—In-plane average refractive index of adjacent layer) is not particularly limited and is 0.25 or less in many cases, but is preferably 0.15 or less from the viewpoint that the effects of the present invention are more excellent. A lower limit value of the difference is not particularly limited, but is 0.01 or more in many cases.

A difference between the in-plane average refractive index of the adjacent layer and the refractive index in the transmission axis direction of the polarizer (In-plane average refractive index of adjacent layer—Refractive index in transmission axis direction of polarizer) is not particularly limited and is 0.20 or less in many cases, but is preferably 0.10 or less from the viewpoint that the effects of the present invention are more excellent. A lower limit value of the difference is not particularly limited, but is 0.01 or more in many cases.

The in-plane average refractive index of the adjacent layer is not particularly limited as long as it satisfies the relationship of Formula (X), but is preferably 1.51 to 1.90, and more preferably 1.55 to 1.70, from the viewpoint that the effects of the present invention are more excellent.

The in-plane average refractive index is intended to mean a refractive index at a wavelength of 550 nm.

Furthermore, the in-plane average refractive index of the adjacent layer is preferably lower than the above-mentioned in-plane average refractive index of the polarizer, from the viewpoint that the effects of the present invention are more excellent. In addition, the in-plane average refractive index of the polarizer is an arithmetic average value of the refractive index in the absorption axis direction of the polarizer and the refractive index in the transmission axis direction of the polarizer {(Refractive index in absorption axis direction of polarizer+Refractive index in transmission axis direction of polarizer)/2}.

The refractive index of the adjacent layer in the direction along the absorption axis direction of the polarizer (the direction along the absorption axis Aa of the polarizer 12 in FIG. 3) is not particularly limited, but it is preferably 1.55 to 1.90, and more preferably 1.55 to 1.70, from the viewpoint that the effects of the present invention are more excellent.

The refractive index of the adjacent layer in the direction along the transmission axis direction of the polarizer (the direction along the transmission axis Ta of the polarizer 12 in FIG. 3) is not particularly limited, but is preferably 1.51 to 1.80, and more preferably 1.51 to 1.70, from the viewpoint that the effects of the present invention are more excellent.

The refractive index is intended to mean a refractive index at a wavelength of 550 nm.

With regard to a method for measuring the refractive index (the in-plane average refractive index of the adjacent layer, the refractive index of the adjacent layer in the direction along the absorption axis direction of the polarizer, the refractive index of the adjacent layer in the direction along the transmission axis direction of the polarizer), an adjacent layer is manufactured on a quartz glass plate and each refractive index of the adjacent layer at a wavelength of 550 nm is measured with a spectroscopic ellipsometer M-2000U manufactured by Woollam Co. Ltd., as described in detail in the section of Examples below.

Furthermore, the direction in which the refractive index in the plane of the layer is maximized is taken as an x-axis, the direction orthogonal to the x-axis in the plane is taken as a y-axis, the direction normal to the plane is taken as a z-axis, the respective refractive indexes are defined as nx, nz, and nz, respectively, and the "in-plane average refractive index $(n_{ave})$" in the present invention is represented by Formula (1).

$$n_{ave}=(n_x+n_y)/2 \qquad \text{Formula (1)}$$

A thickness of the adjacent layer is not particularly limited, but is preferably 0.010 to 2.000 μm, more preferably 0.010 to 0.800 μm, and still more preferably 0.010 to 0.150 μm, from the viewpoint of reducing the thickness.

A size of an optical film thickness d (in-plane average refractive index×thickness) which is a product of the in-plane average refractive index of the adjacent layer and the thickness of the adjacent layer is not particularly limited, but preferably satisfies a relationship of Formula (Y) from the viewpoint that the effects of the present invention are more excellent. As mentioned above, the polarizer used in the present embodiment has a predetermined value or higher of a transmittance in the absorption axis direction, and therefore, the present inventors have found that the effects are enhanced by making the optical film thickness of the adjacent layer for imparting an antireflection ability satisfy the following relationship.

$$70+275 \times n \le d \le 135+275 \times n \qquad \text{Formula (Y)}$$

n represents 0, 1, or 2. Further, a unit of the thickness of the adjacent layer is nm.

In other words, the optical film thickness d may satisfy any one of Formulae (Y1) to (Y3). In addition, Formula (Y1) corresponds to a case where n is 0, Formula (Y2) corresponds to a case where n is 1, and Formula (Y3) corresponds to a case where n is 2.

$$70 \leq d \leq 135 \quad \text{Formula (Y1)}$$

$$345 \leq d \leq 410 \quad \text{Formula (Y2)}$$

$$620 \leq d \leq 685 \quad \text{Formula (Y3)}$$

A type of the component constituting the adjacent layer is not particularly limited as long as it is a layer satisfying the relationship of Formula (X). Examples of the component include an organic substance such as a resin and an inorganic substance such as an inorganic particle. Among those, the adjacent layer preferably includes a resin from the viewpoint that the in-plane average refractive index can be easily adjusted and the adhesiveness to the polarizer is excellent.

Examples of the resin include a poly(meth)acrylate resin, a poly(meth)acrylamide resin, a polyester resin, a polyimide resin, and a polystyrene resin. Further, the adjacent layer may be formed using a curable compound and the adjacent layer may be formed using a thermosetting resin, as described later. Examples of the thermosetting resin include an epoxy resin and an alicyclic epoxy resin. The alicyclic epoxy resin means an epoxy resin having one or more epoxy groups bonded to an alicyclic ring in the molecule.

A content of the resin in the adjacent layer is not particularly limited, but is preferably 50% to 100% by mass, and more preferably 70% to 100% by mass, with respect to a total mass of the adjacent layer, from the viewpoint that the handleability of the adjacent layer is more excellent.

The adjacent layer may include particles together with the resin. Examples of the particles include organic particles, inorganic particles, and organic-inorganic composite particles including an organic component and an inorganic component.

Examples of the organic particles include styrene resin particles, styrene-divinylbenzene copolymer particles, acrylic resin particles, methacrylic resin particles, styrene-acrylic copolymer particles, styrene-methacrylic copolymer particles, melamine resin particles, and resin particles including two or more kinds of these particles.

Examples of a component constituting the inorganic particles include a metal oxide, a metal nitride, a metal oxynitride, and a simple metal. Examples of a metal atom included in the metal oxide, the metal nitride, the metal oxynitride, and the simple metal include a titanium atom, a silicon atom, an aluminum atom, a cobalt atom, and a zirconium atom. Specific examples of the inorganic particles include inorganic oxide particles such as alumina particles, alumina hydrate particles, silica particles, zirconia particles, and clay minerals (for example, smectite).

An average particle diameter of the particles is preferably 1 to 300 nm, and more preferably 10 to 200 nm. In a case where the average particle diameter is within the range, it is possible to obtain a cured product (transparent resin layer) having excellent particle dispersibility as well as excellent high-temperature durability, moisture heat resistance, and transparency.

Here, the average particle diameter of the particles can be determined from a photograph obtained by observation with a transmission electron microscope (TEM) or a scanning electron microscope (SEM). Specifically, a projected area of the particle is determined and an equivalent circle diameter (diameter of a circle) corresponding thereto is taken as an average particle diameter of the particle. In addition, the average particle diameter in the present invention is taken as an arithmetic average value of the equivalent circle diameters obtained for 100 particles.

The particles may have any shape of a spherical shape, a needle shape, a fiber (fibrous shape), a column shape, a planar shape, and the like.

A content of the particles in the adjacent layer is not particularly limited, but is preferably 1% to 50% by mass, and more preferably 1% to 30% by mass, with respect to the total mass of the adjacent layer, from the viewpoint that the in-plane average refractive index of the adjacent layer is easily adjusted.

A method for forming the adjacent layer is not particularly limited, and examples thereof include a method in which a composition for forming the adjacent layer is applied onto a polarizer and as necessary, the coating film is cured.

The composition for forming the adjacent layer includes a component which can constitute the adjacent layer, and examples of the component include a resin, a monomer, and particles. Examples of the resin and the particles are as mentioned above.

Examples of the monomer include a photocurable compound and a thermosetting compound (for example, a thermosetting resin). As the monomer, a monofunctional polymerizable compound including one polymerizable group in one molecule and a polyfunctional polymerizable compound including two or more same or different polymerizable groups in one molecule are preferable. The polymerizable compound may be a monomer or a multimer such as an oligomer and a prepolymer.

Examples of the polymerizable group include a radically polymerizable group and a cationically polymerizable group, and the radically polymerizable group is preferable. Examples of the radically polymerizable group include an ethylenically unsaturated bond group. Examples of the cationically polymerizable group include an epoxy group and an oxetane group.

The composition for forming an adjacent layer may include at least one of an interface modifier, a polymerization initiator, and a solvent. Examples of these components include the compounds exemplified as the components which may be included in the liquid crystalline composition.

A method for applying the composition for forming an adjacent layer is not particularly limited, and examples thereof include the above-mentioned method for applying the liquid crystalline composition.

After applying the composition for forming an adjacent layer, the coating film may be subjected to a drying treatment, as necessary.

Furthermore, in a case where the composition for forming an adjacent layer includes a curable compound such as a monomer, the coating film may be subjected to a curing treatment after the application of the composition for forming an adjacent layer.

Examples of the curing treatment include a photocuring treatment and a thermosetting treatment, and optimal conditions are selected according to a material to be used.

The polarizing plate may include a member other than the polarizer and the adjacent layer in contact with the polarizer, as mentioned above.

For example, the polarizing plate may include a transparent support on the surface of the polarizer opposite to the adjacent layer. Examples of the transparent support are as described above.

Furthermore, in a case where the polarizing plate includes a transparent support, an alignment film may be further included between the transparent support and the polarizer.

The alignment film generally contains a polymer as a main component. Polymers for the alignment film have been described in many documents and many commercial products thereof can be obtained. The polymer to be used is preferably polyvinyl alcohol (PVA), polyimide, or a derivative thereof.

Furthermore, as the alignment film, a film which is subjected to a known rubbing treatment is preferable.

In addition, a photo-alignment film may be used as the alignment film. The photo-alignment film can be produced by subjecting linearly polarized light or non-polarized light to the photo-alignment compound. As the photo-alignment compound, a photosensitive compound having a photoreactive group in which at least one of dimerization or isomerization is caused by the action of light is preferable. In addition, the photoreactive group preferably has a skeleton of at least one derivative or compound selected from the group consisting of a cinnamic acid derivative, a coumarin derivative, a chalcone derivative, a maleimide derivative, an azobenzene compound, a polyimide compound, a stilbene compound, and a spiropyran compound.

A thickness of the alignment film is preferably 0.01 to 10 m.

<Circularly Polarizing Plate>

The above-mentioned polarizing plate can be used as a circularly polarizing plate in combination with a λ/4 plate.

Figure 4:
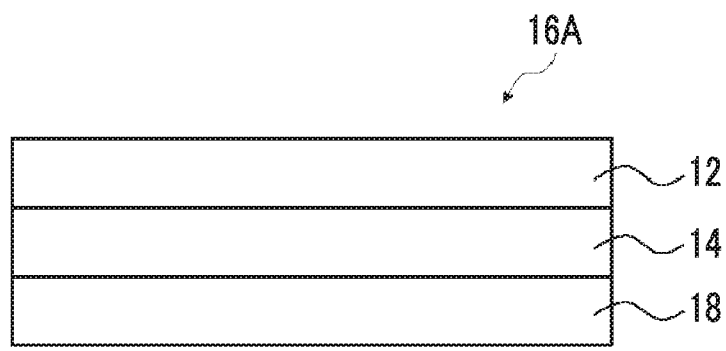
FIG. 4 is a cross-sectional view of a first embodiment of a circularly polarizing plate.

Specifically, as shown in FIG. 4, a circularly polarizing plate 16A includes a polarizer 12, an adjacent layer 14, and a λ/4 plate 18. As shown in FIG. 4, the adjacent layer 14 is disposed between the polarizer 12 and the λ/4 plate 18. Further, it is preferable that an angle formed between the in-plane slow axis of the λ/4 plate 18 and the absorption axis of the polarizer 12 is adjusted to be 45°±10°.

The description of the polarizer 12 and the adjacent layer 14 is as mentioned above.

Hereinafter, the λ/4 plate 18 will be mainly described in detail.

The λ/4 plate is a plate having a λ/4 function, specifically, a plate having a function of converting linearly polarized light at a certain specific wavelength into circularly polarized light (or converting circularly polarized light into linearly polarized light).

Specific examples of the λ/4 plate include US2015/0277006A.

For example, specific examples of an aspect in which the λ/4 plate has a monolayer structure include a stretched polymer film and an optically anisotropic layer formed using a liquid crystalline compound, and specific examples of an aspect in which the λ/4 plate has a multilayer structure include a broadband λ/4 plate obtained by laminating a λ/4 plate and λ/2 plate.

An Re(550) of the λ/4 plate is not particularly limited, but is preferably 110 to 160 nm, and more preferably 120 to 150 nm, from the viewpoint of usefulness as λ/4 plate.

The λ/4 plate preferably exhibits reciprocal wavelength dispersibility. Exhibition of the reciprocal wavelength dispersibility of the λ/4 plate means that an Re value becomes equal or higher as a measurement wavelength is increased in a case where an in-plane retardation (Re) value at a specific wavelength (visible light range) is measured.

A method for forming the λ/4 plate is not particularly limited, and examples thereof include a method in which a composition for forming λ/4 plate, including a liquid crystalline compound, is applied onto a transparent support and the liquid crystalline compound included in the coating film is aligned.

Examples of the transparent support include a transparent support used at the time of forming a polarizer. Further, the composition for forming a λ/4 plate may also be applied onto an alignment film provided on the transparent support.

The liquid crystalline compound may have a polymerizable group. Examples of the polymerizable group include a radically polymerizable group and a cationically polymerizable group.

In a case where the liquid crystalline compound has a polymerizable group, the coating film may be subjected to a curing treatment (for example, a thermosetting treatment and a photocuring treatment) after the liquid crystalline compound in the coating film is aligned.

Among those, as the λ/4 plate, a film obtained by applying a composition for forming a λ/4 plate, including a liquid crystalline compound having a polymerizable group, aligning the liquid crystalline compound included in the coating film, and polymerizing and fixing the aligned liquid crystalline compound is preferable.

The circularly polarizing plate may include a member other than the polarizer, the adjacent layer, and the λ/4 plate, as described above.

For example, the circularly polarizing plate may further include a transparent support. Examples of the transparent support are as described above. In a case where the circularly polarizing plate includes a transparent support, the transparent support may be disposed between the adjacent layer and the λ/4 plate or on the surface of the polarizer opposite to the adjacent layer.

Furthermore, the circularly polarizing plate may further include an alignment film between the adjacent layer and the λ/4 plate.

In addition, the circularly polarizing plate may include at least one of a hardcoat layer or an antireflection layer on the surface of the polarizer opposite to the adjacent layer. The configuration of the antireflection layer is not particularly limited, a known configuration can be employed, and examples thereof include an aspect including a medium refractive index layer, a high refractive index layer, and a low refractive index layer.

<Display Device>

The above-mentioned circularly polarizing plate can be disposed on the display element to impart a function of preventing external light reflection to the display element.

Figure 5:
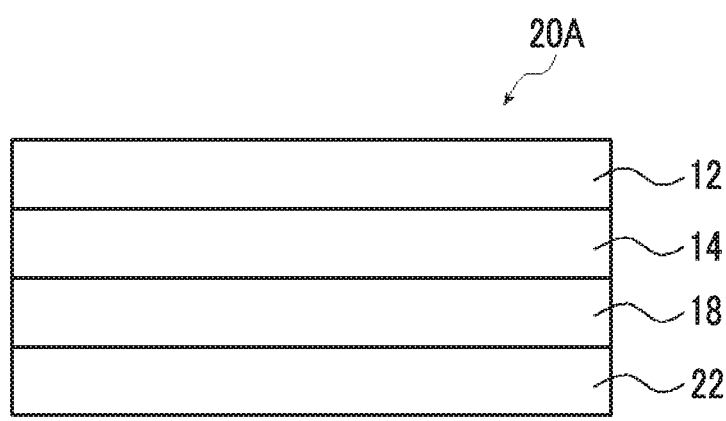
FIG. 5 is a cross-sectional view of a first embodiment of a display device.

Specifically, as shown in FIG. 5, a display device 20A includes a polarizer 12, an adjacent layer 14, a λ/4 plate 18, and a display element 22. The display device 20A is visually recognized by an observer from the polarizer 12 side. That is, the polarizer 12 side corresponds to the visual recognition side.

The description of the polarizer 12, the adjacent layer 14, and the λ/4 plate 18 is as described above.

Hereinafter, the display element 22 will be mainly described in detail.

A type of the display element is not particularly limited, and examples thereof include an organic EL display element, and an image display element such as a liquid crystal display element, and the organic EL display element is suitably used.

A configuration of the organic EL display element is not particularly limited, and usually includes at least an organic light emitting layer and a pair of electrodes sandwiching the organic light emitting layer.

Second Embodiment

Hereinafter, a second embodiment of the polarizing plate, the circularly polarizing plate, and the display device of the present invention will be described with reference to the drawings.

Figure 6:
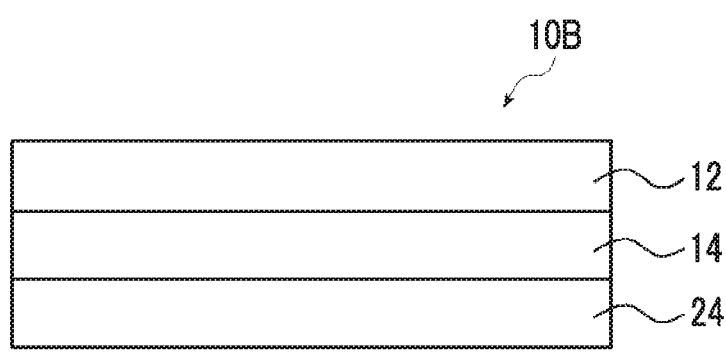
FIG. 6 is a cross-sectional view of a second embodiment of the polarizing plate.

FIG. 6 shows a second embodiment of the polarizing plate of the present invention. A polarizing plate 10B shown in FIG. 2 includes a polarizer 12, an adjacent layer 14 disposed so as to be in contact with the surface of the polarizer 12, and an optical functional layer 24 disposed so as to be in contact with the surface of the adjacent layer 14 opposite to the polarizer 12 side.

The first embodiment of the polarizing plate shown in FIG. 2 and the second embodiment of the polarizing plate shown in FIG. 6 have the same configuration, except that the second embodiment includes the optical functional layer 24. Hereinafter, the optical functional layer 24 will be mainly described.

The optical functional layer is a layer in contact with the surface of the adjacent layer opposite to the polarizer side.

The in-plane average refractive index of the optical functional layer is not particularly limited and is 1.40 to 1.70 in many cases, and among those, it is preferably 1.49 to 1.60 from the viewpoint that the effects of the present invention are more excellent.

As described in detail in the section of Examples below, with regard to a method for measuring the in-plane average refractive index of the optical functional layer, an optical functional layer is manufactured on a quartz glass plate, the refractive index in the respective directions (x-axis, y-axis, z-axis) of the optical functional layer are measured with a spectroscopic ellipsometer M-2000U manufactured by Woollam Co. Ltd., as described in detail in the section of Examples below, and thus, the in-plane average refractive index can be calculated.

A type of the component constituting the optical functional layer is not particularly limited, and examples thereof include an organic substance such as a resin and an inorganic substance such as inorganic particles. Examples of the type of the resin and the type of the particle include the resins and the particles which may be included in the adjacent layer as mentioned above.

The optical functional layer may have another function, and may be, for example, an adhesive layer. That is, the optical functional layer is preferably an adhesive layer having an in-plane average refractive index of 1.49 to 1.60. The adhesive layer is a layer having a function for bonding members together.

In a case where the optical functional layer is an adhesive layer, the adhesive layer may be formed of any one of a pressure-sensitive adhesive or an adhesive.

A relationship between the in-plane average refractive index of the optical functional layer and the in-plane average refractive index of the adjacent layer is not particularly limited, but it is preferable that the in-plane average refractive index of the adjacent layer is larger than the in-plane average refractive index the optical functional layer from the viewpoint that the effects of the present invention are more excellent.

A thickness of the optical functional layer is not particularly limited, but is preferably 1 to 30 μm, and more preferably 1 to 3 μm, from the viewpoint of reducing the thickness.

The above-mentioned polarizing plate can be used as a circularly polarizing plate in combination with a λ/4 plate.

Figure 7:
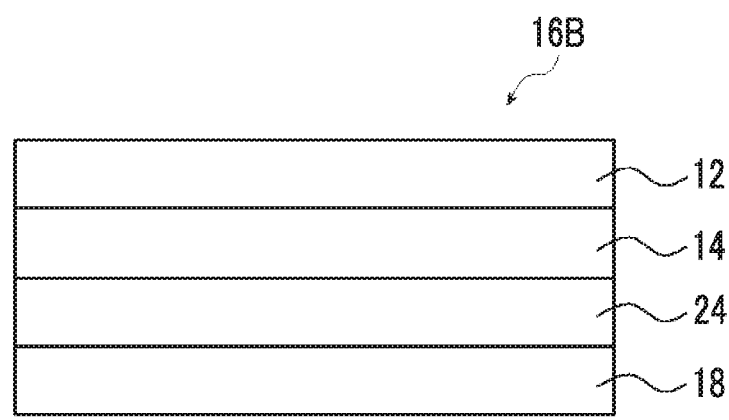
FIG. 7 is a cross-sectional view of a second embodiment of the circularly polarizing plate.

Specifically, as shown in FIG. 7, a circularly polarizing plate 16B includes a polarizer 12, an adjacent layer 14, an optical functional layer 24, and a λ/4 plate 18. As shown in FIG. 7, the adjacent layer 14 and the optical functional layer 24 are disposed between the polarizer 12 and the λ/4 plate 18. Further, it is preferable that an angle formed between the in-plane slow axis of the λ/4 plate 18 and the absorption axis of the polarizer 12 is adjusted to be 45°+10°.

The description of the polarizer 12, the adjacent layer 14, the λ/4 plate 18, and the optical functional layer 24 is as mentioned above.

Figure 8:
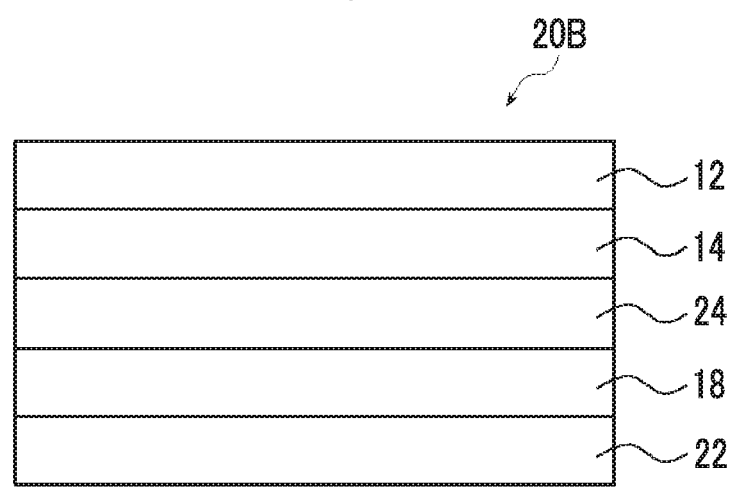
FIG. 8 is a cross-sectional view of a second embodiment of the display device.

The above-mentioned circularly polarizing plate can be disposed on the display element to impart a function of preventing external light reflection to the display element. Specifically, as shown in FIG. 8, a display device 20B includes a polarizer 12, an adjacent layer 14, an optical functional layer 24, a λ/4 plate 18, and a display element 22. The display device 20B is visually recognized by an observer from the polarizer 12 side. That is, the polarizer 12 side corresponds to the visual recognition side.

The description of the polarizer 12, the adjacent layer 14, the λ/4 plate 18, the optical functional layer 24, and the display element 22 is as mentioned above.

EXAMPLES

Hereinafter, the present invention will be described in more details with reference to Examples. The materials, the amounts to materials used, the ratios, the treatment details, and the treatment procedure shown in the following Examples can be modified as appropriate while not departing from the spirit of the present invention. Therefore, the scope of the present invention will not be restrictively interpreted by the following Examples.

Example 1

(Manufacture of Transparent Support 1)

A TAC base material (TG40, manufactured by FUJIFILM Corporation) having a thickness of 40 μm was prepared, a surface thereof was hydrophilized by a saponification treatment, and then a coating liquid having the following formulation was continuously applied thereonto with a #8 wire bar. Thereafter, the obtained TAC base material was dried with hot air at 100° C. for 2 minutes to obtain a transparent support 1 having a polyvinyl alcohol (PVA) film having a thickness of 0.8 μm disposed on the TAC base material. In addition, a modified polyvinyl alcohol was added to a coating liquid such that the concentration of the solid content became 4% by mass.

| Composition of coating liquid | |
|---|---|
| The following modified polyvinyl alcohol | |
| Water | 70 parts by mass |
| Methanol | 30 parts by mass |

Modified Polyvinyl Alcohol

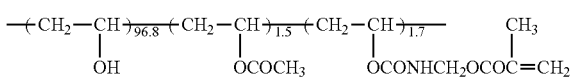

(Formation of Alignment Film 1)

To a photo-alignment material E-1 (1 part by mass) having the following structure were added butoxyethanol (41.6 parts by mass), dipropylene glycol monomethyl (41.6 parts by mass), and pure water (15.8 parts by mass), and the obtained solution was pressure-filtered through a 0.45-μm membrane filter to prepare a composition 1 for forming an alignment film. Next, the obtained composition 1 for forming an alignment film was applied onto the surface of the transparent support 1 on which the modified polyvinyl alcohol had been applied, and dried at 60° C. for 1 minute. Thereafter, the obtained applied coating film was irradiated with linear polarized ultraviolet rays (an illuminance of 4.5 mW, an irradiation dose of 500 mJ/cm$^2$) using a polarized ultraviolet exposure device to manufacture an alignment film 1.

E-1

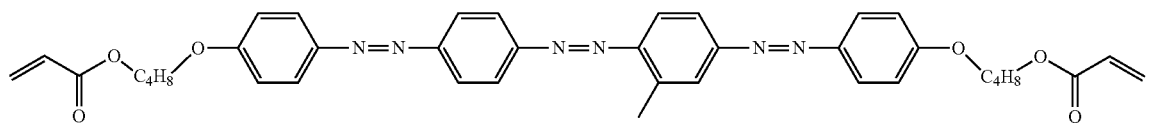

(Formation of Polarizer (Light-Absorbing Anisotropic Layer))

A composition P1 for forming a polarizer, having the following formulation, was prepared, dissolved by heating at 50° C. for 1 hour with stirring, and filtered through a 0.45-μm membrane filter.

| Composition P1 for forming polarizer | |
|---|---|
| The following dichroic azo colorant compound D1 | 2.2 parts by mass |
| The following dichroic azo colorant compound D2 | 9.4 parts by mass |
| The following high-molecular liquid crystal compound M1 | 72.1 parts by mass |
| Polymerization initiator IRGACURE 819 (manufactured by BASF) | 0.7 part by mass |
| The following interface modifier F-1 | 0.6 parts by mass |
| Cyclopentanone | 274.5 parts by mass |
| Tetrahydrofuran | 640.5 parts by mass |

Dichroic Azo Colorant Compound D1

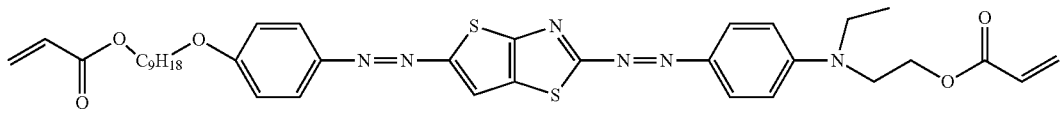

Dichroic Azo Colorant Compound D2

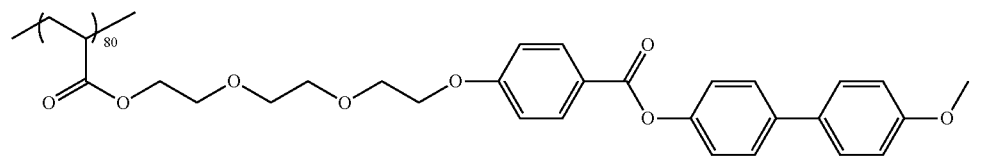

High-Molecular Liquid Crystal Compound M1

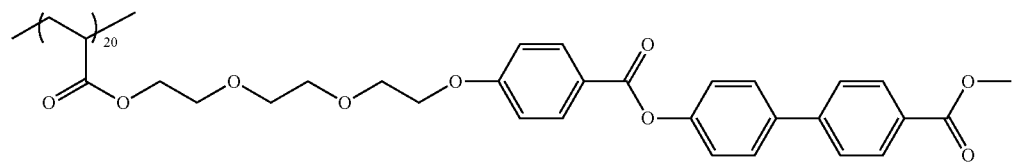

Interface Modifier F-1

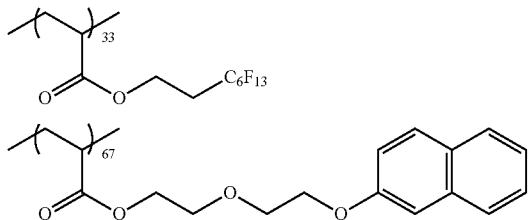

CPI-100P

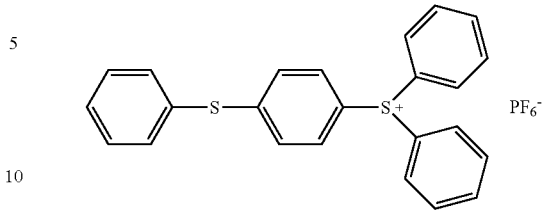

The composition P1 for forming a polarizer was applied onto the obtained alignment film 1 with a wire bar so that the WET application amount was 5.1 cc/m².

Subsequently, the obtained coating film was heated at 140° C. for 90 seconds and cooled to room temperature (23° C.).

Next, the obtained coating film was heated at 80° C. for 60 seconds and cooled again to room temperature.

Thereafter, the coating film was irradiated for 60 seconds under an irradiation condition of an illuminance of 28 mW/cm² using a high-pressure mercury lamp to form a polarizer (having a thickness of 0.5 μm).

(Formation of Adjacent Layer 1)

The curable composition 1 was continuously applied onto a polarizer with a #2 wire bar, and dried at 40° C. for 90 seconds.

Thereafter, the coating film was irradiated for 60 seconds under an irradiation condition of an illuminance of 28 mW/cm² using a high-pressure mercury lamp, thereby producing a laminate 1 (corresponding to a polarizing plate) in which the adjacent layer 1 was formed on the polarizer.

A cross-section of the adjacent layer 1 was cut using a microtome cutting machine, the film thickness was measured by observation with a scanning electron microscope (SEM), and as a result, the film thickness of the adjacent layer 1 was 700 nm.

| Curable composition 1 | |
|---|---|
| CEL2021P (manufactured by Daicel) | 32 parts by mass |
| Polymerization initiator IRGACURE 819 (manufactured by BASF) | 1 part by mass |
| Alumina ethanol sol A2K5-10 (manufactured by Kawaken Fine Chemical Co., Ltd., colloid liquid having columnar alumina hydrate particles dispersed in a liquid state) | 65 parts by mass |
| CPI-100P (50% propylene carbonate solution) | 2 parts by mass |

CEL2021P

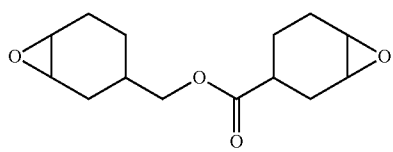 [SMILES: O=C(OCC1CCC2OC2C1)C1CCC2OC2C1]

<Preparation of λ/4 Plate>

(Synthesis of Polymer E-2)

Into a reaction vessel provided with a stirrer, a thermometer, a dripping funnel, and a reflux cooling pipe were introduced 2-(3,4-epoxycyclohexyl)ethyltrimethoxysilane (100.0 parts by mass), methyl isobutyl ketone (500 parts by mass), and triethylamine (10.0 parts by mass), and the mixture was stirred at room temperature. Next, deionized water (100 parts by mass) was added dropwise to the obtained mixture for 30 minutes with a dripping funnel, and then allowed to undergo a reaction at 80° C. for 6 hours while mixing the mixture under reflux. After completion of the reaction, the organic phase was extracted from the obtained mixture and washed until water after the washing became neutral with a 0.2%-by-mass aqueous ammonium nitrate solution. Thereafter, the solvent and water were distilled off under reduced pressure from the obtained organic phase to obtain a polyorganosiloxane having an epoxy group as a viscous transparent liquid.

The polyorganosiloxane having an epoxy group was subjected to ¹H-Nuclear Magnetic Resonance (NMR) analysis, and thus, it was confirmed that peaks based on an oxiranyl group around a chemical shift (d)=3.2 ppm were obtained as per theoretical strength, and a side reaction of the epoxy group did not occur during the reaction. The weight-average molecular weight Mw and the epoxy equivalent of the polyorganosiloxane having an epoxy group were 2,200 and 186 g/mole, respectively.

Next, into a 100-mL three-necked flask were introduced the polyorganosiloxane (10.1 parts by mass) having an epoxy group obtained above, an acryloyl group-containing carboxylic acid (manufactured by Toagosei Co., Ltd., trade name "ARONIX M-5300", ω-carboxypolycaprolactone acrylate (a degree of polymerization of n=2)) (0.5 parts by mass), butyl acetate (20 parts by mass), a cinnamic acid derivative (1.5 parts by mass) obtained by the method of Synthesis Example 1 of JP2015-026050A, and tetrabutylammonium bromide (0.3 parts by mass), and the obtained mixture was stirred at 90° C. for 12 hours. After stirring, the mixture was diluted using butyl acetate in the same amount (mass) as that of the obtained mixture, and the diluted mixture was washed with water three times. An operation in which the obtained mixture was concentrated and diluted using butyl acetate was repeated twice to finally obtain a solution including polyorganosiloxane (the following polymer E-2) having a photo-alignment group. The weight-average molecular weight Mw of the polymer E-2 was 9,000. In addition, as a result of ¹H-NMR analysis, the amount of the components having a cinnamate group in the polymer E-2 was 23.7% by mass.

E-2

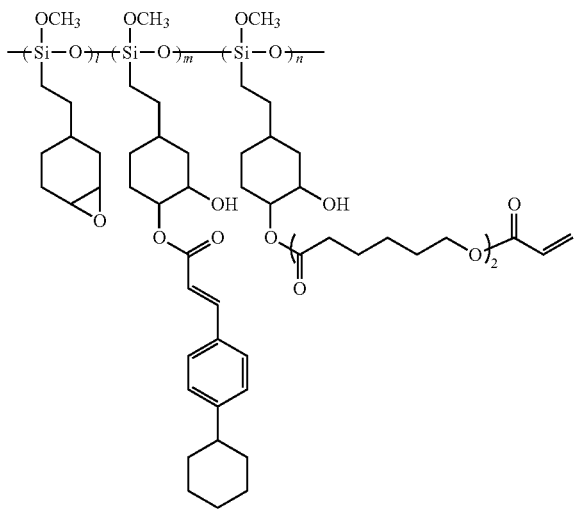

(Preparation of Composition 2 for Forming Alignment Film)

The following components were mixed to produce a composition 2 for forming an alignment film.

| | |
|---|---|
| The polymer E-2 | 10.67 parts by mass |
| The following low-molecular compound R-1 | 5.17 parts by mass |
| The following additive (B-1) | 0.53 parts by mass |
| Butyl acetate | 8,287.37 parts by mass |
| Propylene glycol monomethyl ether acetate | 2,071.85 parts by mass | compound R-1

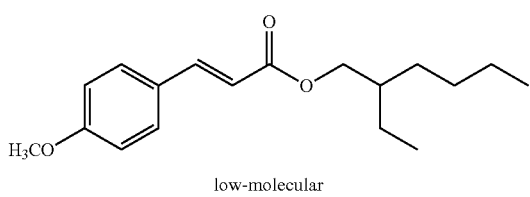

low-molecular

Additive (B-1): TA-60B manufactured by San-Apro Limited (refer to the following structural formula)

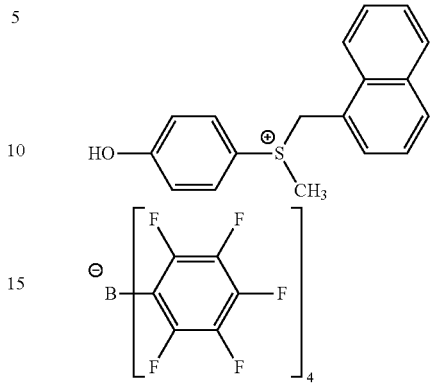

(Preparation of Composition for Forming λ/4 Plate)

A composition for forming a λ/4 plate having the following formulation was prepared.

| Composition for forming λ/4 plate | |
|---|---|
| The following Liquid crystalline compound L-3 | 42.00 parts by mass |
| The following liquid crystalline compound L-4 | 42.00 parts by mass |
| The following polymerizable compound A-1 | 16.00 parts by mass |
| The following low-molecular compound B2 | 6.00 parts by mass |
| The following polymerization initiator S-1 (oxime-type) | 0.50 parts by mass |
| The following leveling agent G-1 | 0.20 parts by mass |
| HISOLVE MTEM (manufactured by TOHO Chemical Industry Co., Ltd.) | 2.00 parts by mass |
| NKester A-200 (manufactured by Shin Nakamura Chemical Co., Ltd.) | 1.00 part by mass |
| Methyl ethyl ketone | 424.8 parts by mass |

In addition, a group adjacent to the acryloyloxy group of each of the following liquid crystalline compounds L-3 and L-4 represents a propylene group (a group in which is a methyl group is substituted with an ethylene group), and the following liquid crystalline compounds L-3 and L-4 each represent a mixture of regioisomers having different positions of the methyl groups.

L-3

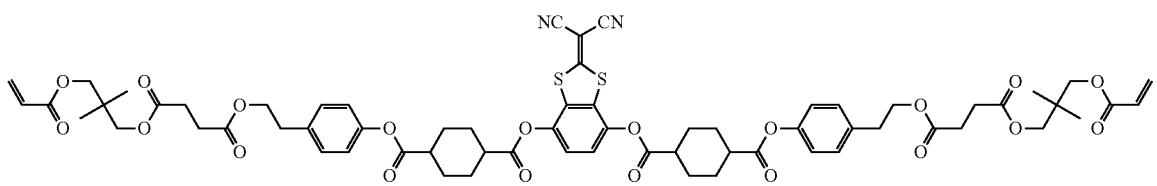

L-4

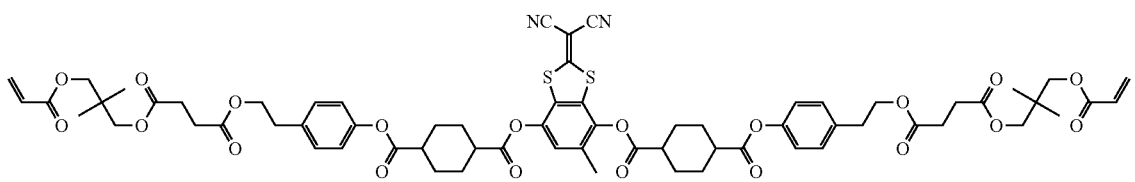

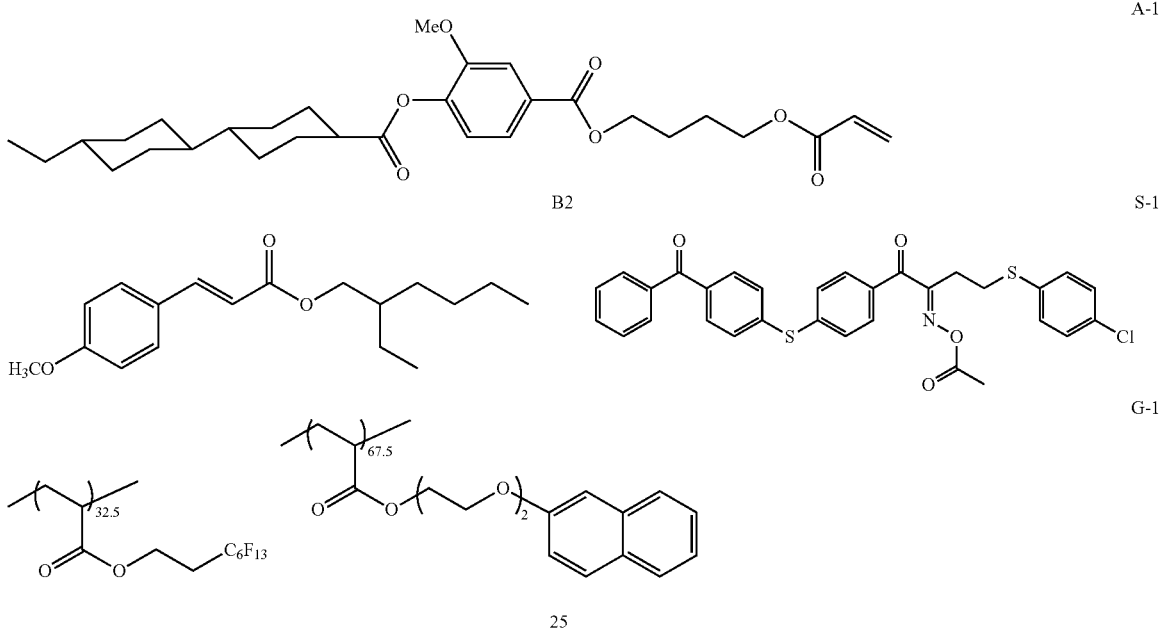

(Manufacture of Cellulose Acylate Film 1)

The following composition was introduced into a mixing tank and stirred to prepare a cellulose acetate solution for use as a core layer cellulose acylate dope.

| Core layer cellulose acylate dope | |
|---|---|
| Cellulose acetate having a degree of acetyl substitution of 2.88 | 100 parts by mass |
| Polyester compound B described in Examples of JP2015-227955A | 12 parts by mass |
| The following compound F | 2 parts by mass |
| Methylene chloride (first solvent) | 430 parts by mass |
| Methanol (second solvent) | 64 parts by mass |

Compound F

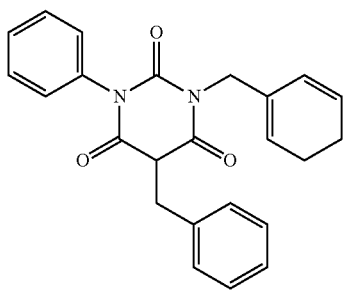 [SMILES: O=C1C(Cc2ccccc2)C(=O)N(c2ccccc2)C(=O)N1CC1=CCCC=C1]

The following matting agent solution (10 parts by mass) was added to the above-mentioned core layer cellulose acylate dope (90 parts by mass) to prepare an outer layer cellulose acylate dope.

| Matting agent solution | |
|---|---|
| Silica particles having an average particle diameter of 20 nm (AEROSIL R972 manufactured by Nippon Aerosil Co., Ltd.) | 2 parts by mass |
| Methylene chloride (first solvent) | 76 parts by mass |
| Methanol (second solvent) | 11 parts by mass |
| The core layer cellulose acylate dope | 1 part by mass |

The core layer cellulose acylate dope and the outer layer cellulose acylate dope were filtered through a filter paper having an average pore diameter of 34 μm and a sintered metal filter having an average pore diameter of 10 m, and then three layers of the core layer cellulose acylate dope and the outer layer cellulose acylate dope on both sides thereof were cast on a drum at 20° C. from the casting ports at the same time (band casting machine).

Subsequently, the film was peeled in the state where the content of the solvent of the film on the drum reached approximately 20% by mass, the both terminals of the film in the width direction were fixed with tenter clips, and the film was dried while being stretched at a stretching ratio of 1.1 times in the horizontal direction.

Thereafter, the film was transported between rolls in a heating treatment device and further dried to manufacture a cellulose acylate film 1 having a thickness of 40μ. The in-plane retardation at a wavelength of 550 nm of the cellulose acylate film 1 was 0 nm.

The composition 2 for forming an alignment film produced in advance was applied onto the surface on one side of the manufactured cellulose acylate film 1. Thereafter, the film was dried in a hot plate at 120° C. for 1 minute to remove the solvent from the coating film, thereby forming a photoisomerization composition layer having a thickness of 0.3 mm.

The obtained photoisomerization composition layer was irradiated with polarized ultraviolet rays (10 mJ/cm², using an ultra-high-pressure mercury lamp) to form a photo-alignment film.

Subsequently, the composition for forming λ/4 plate prepared in advance was applied onto the photo-alignment film with a bar coater to form a composition layer. The formed composition layer was first heated in a hot plate to 110° C. and then cooled 60° C. to stabilize the alignment.

Thereafter, while keeping the temperature at 60° C., the alignment was fixed by irradiation with ultraviolet rays (500 mJ/cm², using an ultra-high-pressure mercury lamp) in a nitrogen atmosphere (an oxygen concentration of 100 ppm) to manufacture a phase difference film including a λ/4 plate having a thickness of 2.3 μm. The in-plane retardation at a wavelength of 550 nm of the obtained λ/4 plate was 140 nm.

(Manufacture of Antireflection Film)

As shown below, a coating liquid for forming each layer was prepared and each layer was formed, thereby manufacturing an antireflection film.

(Preparation of Composition for Forming Hardcoat Layer)

Trimethylolpropane triacrylate (VISCOAT #295 (manufactured by Osaka Organic Chemical Co., Ltd.)) (750.0 parts by mass), poly(glycidyl methacrylate) having a mass-average molecular weight of 15,000 (270.0 parts by mass), methyl ethyl ketone (730.0 parts by mass), cyclohexanone (500.0 parts by mass), and a photopolymerization initiator (IRGACURE 184, manufactured by Ciba Specialty Chemicals Inc.) (50.0 parts by mass) were mixed. The obtained mixture was filtered through a polypropylene-made filter having a pore diameter of 0.4 μM to prepare a composition for forming a hardcoat layer.

(Preparation of Composition A for Forming Medium Refractive Index Layer)

A ZrO₂ fine particle-containing hardcoat agent (DESOLITE Z7404 [refractive index: 1.72, a concentration of the solid content: 60% by mass, zirconium oxide fine particle content: 70% by mass (with respect to the solid content), an average particle diameter of zirconium oxide fine particles: about 20 nm, solvent formulation: methyl isobutyl ketone/methyl ethyl ketone=9/1, manufactured by JSR Corporation]) (5.1 parts by mass), a mixture of dipentaerythritol pentaacrylate and dipentaerythritol hexaacrylate (DPHA) (1.5 parts by mass), a photopolymerization initiator (IRGACURE 907, manufactured by Ciba Specialty Chemicals Inc.) (0.05 parts by mass), methyl ethyl ketone (66.6 parts by mass), methyl isobutyl ketone (7.7 parts by mass), and cyclohexanone (19.1 parts by mass) were mixed. After sufficiently stirring the obtained mixture, the mixture was filtered through a polypropylene-made filter having a pore diameter of 0.4 μm to prepare a composition A for forming a medium refractive index layer.

(Preparation of Composition B for Forming Medium Refractive Index Layer)

A mixture of dipentaerythritol pentaacrylate and dipentaerythritol hexaacrylate (DPHA) (4.5 parts by mass), a photopolymerization initiator (IRGACURE 184, manufactured by Ciba Specialty Chemicals Inc.) (0.14 parts by mass), methyl ethyl ketone (66.5 parts by mass), methyl isobutyl ketone (9.5 parts by mass), and cyclohexanone (19.0 parts by mass) were mixed. After sufficiently stirring the obtained mixture, the mixture was filtered through a polypropylene-made filter having a pore diameter of 0.4 μm to prepare a composition B for forming a medium refractive index layer.

Appropriate amounts of the composition A for forming a medium refractive index layer and the composition B for forming a medium refractive index layer were mixed so that the refractive index became 1.62, thereby preparing a composition for forming a medium refractive index layer.

(Preparation of Composition for Forming High Refractive Index Layer)

A ZrO₂ fine particle-containing hardcoat agent (DESOLITE Z7404 [refractive index: 1.72, a concentration of the solid content: 60% by mass, zirconium oxide fine particle content: 70% by mass (with respect to the solid content), an average particle diameter of zirconium oxide fine particles: about 20 nm, solvent formulation: methyl isobutyl ketone/methyl ethyl ketone=9/1, manufactured by JSR Corporation]) (15.7 parts by mass), methyl ethyl ketone (61.9 parts by mass), methyl isobutyl ketone (3.4 parts by mass), and cyclohexanone (1.1 parts by mass) were mixed. The obtained mixture was filtered through a polypropylene-made filter having a pore diameter of 0.4 m to prepare a composition for forming a high refractive index layer.

(Preparation of Composition for Forming Low Refractive Index Layer)

(Synthesis of Perfluoroolefin Copolymer (1))

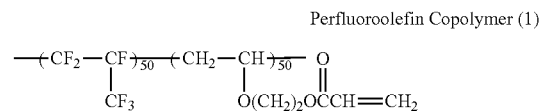

Perfluoroolefin Copolymer (1)

In the structural formula, 50:50 indicates a molar ratio.

In a stainless steel-made autoclave having an inner volume of 100 ml and equipped with a stirrer, ethyl acetate (40 ml), hydroxyethyl vinyl ether (14.7 g), and dilauroyl peroxide (0.55 g) were charged, and the inside of the system was degassed and displaced with nitrogen gas. Further, hexafluoropropylene (25 g) was introduced into the autoclave, and the temperature was elevated to 65° C. A pressure in a case where the temperature in the autoclave reached 65° C. was 0.53 MPa (5.4 kg/cm²). The reaction was continued for 8 hours while keeping this temperature, and in a case where the pressure reached 0.31 MPa (3.2 kg/cm²), heating was stopped and the mixture was allowed to be cooled. In a case where the internal temperature dropped to room temperature, the unreacted monomers were expelled and the autoclave was opened to take out the reaction solution. The obtained reaction solution was poured into a large excess of hexane, the solvent was removed by decantation, and the precipitated polymer was taken out. In addition, the obtained polymer was dissolved in a small amount of ethyl acetate and reprecipitated twice from hexane to completely remove the residual monomers, and after drying, a polymer (28 g) was obtained.

Next, after dissolving this polymer (20 g) in N, N-dimethylacetamide (100 ml) to obtain a solution, and acrylic acid chloride (11.4 g) was added dropwise to the solution under ice-cooling, followed by stirring at room temperature for 10 hours. Ethyl acetate was added to the reaction solution, the mixture was washed with water, the organic phase was extracted and then concentrated, and the obtained polymer was reprecipitated from hexane to obtain a perfluoroolefin copolymer (1) (19 g). The refractive index of the obtained polymer was 1.422.

(Preparation of Hollow Silica Particle Dispersion Liquid)

A hollow silica particle sol (isopropyl alcohol silica sol, CS60-IPA manufactured by Catalyst Chemical Industry Co., Ltd., an average particle diameter of 60 nm, a shell thickness of 10 nm, a silica concentration of 20%, a silica particle refractive index of 1.31) (500 parts by mass), acryloyloxypropyltrimethoxysilane (30.5 parts by mass), and diisopropoxyaluminum ethyl acetate (1.51 parts by mass) were mixed, and then ion exchanged water (9 parts by mass) was further added thereto.

Next, the obtained solution was reacted at 60° C. for 8 hours and then cooled to room temperature, and acetylacetone (1.8 parts by mass) was added thereto to obtain a dispersion liquid. Thereafter, solvent replacement by reduced-pressure distillation was performed at a pressure of 30 Torr while keeping the silica content almost constant by the addition of cyclohexanone, and finally, adjustment of the concentration was performed to obtain a hollow silica particle dispersion liquid having a concentration of the solid content of 18.2% by mass. The residual amount of isopropyl alcohol (IPA) in the obtained dispersion liquid was analyzed by gas chromatography and found to be 0.5% or less.

Using the obtained hollow silica particle liquid dispersion liquid or sol solution, a composition according to the following formulation was mixed, and the obtained solution was stirred and then filtered through a polypropylene-made filter having a pore diameter of 1 μm to prepare a composition for forming a low refractive index layer.

| (Formulation of Composition for Forming Low Refractive Index Layer) | |
|---|---|
| DPHA | 14.5 g |
| P-1 | 24.5 g |
| Hollow silica particle dispersion liquid | 302.2 g |
| RMS-033 | 5.0 g |
| IRGACURE 907 | 1.0 g |
| Methyl ethyl ketone | 1.750 parts by mass |
| Cyclohexanone | 223.0 parts by mass |

The compounds, respectively used in the composition for forming a low refractive index layer, are shown below.

P-1: Perfluoroolefin copolymer (1)

DPHA: A mixture of dipentaerythritol pentaacrylate and dipentaerythritol hexaacrylate (manufactured by Nippon Kayaku Co., Ltd.)

RMS-033: Reactive silicone (manufactured by Gelest Co., Ltd.)

IRGACURE 907: Photopolymerization initiator (manufactured by Ciba Specialty Chemicals Inc.)

(Preparation of Hardcoat Layer)

The composition for forming a hardcoat layer was applied to a TAC base material (TG40, manufactured by FUJIFILM Corporation) having a thickness of 40 m, using a gravure coater. The coating film was dried to 100° C. and then cured by irradiation with ultraviolet rays at an illuminance of 400 mW/cm$^2$ and an irradiation dose of 150 mJ/cm$^2$, using an air-cooled metal halide lamp (manufactured by Eye Graphics Co., Ltd.) at 160 W/cm while purging the system with nitrogen to give an atmosphere having an oxygen concentration of 1.0% by volume or less, whereby forming a hardcoat layer having a thickness of 12 μm.

The composition for forming a medium refractive index layer, the composition for forming a high refractive index layer, and the composition for forming a low refractive index layer were applied onto the obtained hardcoat layer, which had been adjusted to have the respective desired refractive indexes, using a gravure coater, thereby manufacturing an antireflection film.

Furthermore, with regard to the refractive index of each layer, the composition for forming each layer was applied onto a glass plate such that the thickness reached about 4 μm and the refractive index was measured using a multi-wavelength Abbe refractometer DR-M2 (manufactured by Atago Co., Ltd.).

In addition, the refractive index measured using a filter of "an interference filter 546(e) nm for DR-M2, M4, a part number: RE-3523" was adopted as the refractive index at a wavelength of 550 nm.

The film thickness of each layer was calculated using a reflection spectral thickness meter "FE-3000" (manufactured by Otsuka Electronics Co., Ltd.) after laminating the medium refractive index layer, the high refractive index layer, and the low refractive index layer in this order. As the refractive index of each layer at the time of calculation, a value derived by the Abbe refractometer was used.

For the medium refractive index layer, the drying condition was set to 90° C. for 30 seconds and the ultraviolet curing condition was set to an illuminance of 300 mW/cm$^2$ and an irradiation dose of 240 mJ/cm$^2$, using an air-cooled metal halide lamp (manufactured by Eye Graphics Co., Ltd.) at 180 W/cm while purging the system with nitrogen to give an atmosphere having an oxygen concentration of 1.0% by volume or less.

The medium refractive index layer after curing had a refractive index of 1.62 and a layer thickness of 60 nm.

For the high refractive index layer, the drying condition was set to 90° C. for 30 seconds and the ultraviolet curing condition was set to an illuminance of 300 mW/cm$^2$ and an irradiation dose of 240 mJ/cm$^2$, using an air-cooled metal halide lamp (manufactured by Eye Graphics Co., Ltd.) at 240 W/cm while purging the system with nitrogen to give an atmosphere having an oxygen concentration of 1.0% by volume or less. The high refractive index layer after curing had a refractive index of 1.72 and a layer thickness of 110 nm.

For the low refractive index layer, the drying condition was set to 90° C. for 30 seconds and the ultraviolet curing condition was set to an illuminance of 600 mW/cm$^2$ and an irradiation dose of 600 mJ/cm$^2$, using an air-cooled metal halide lamp (manufactured by Eye Graphics Co., Ltd.) at 240 W/cm while purging the system with nitrogen to give an atmosphere having an oxygen concentration of 0.1% by volume or less. The cured low refractive index layer had a refractive index of 1.36 and a thickness of 90 nm.

(Manufacture of Circularly Polarizing Plate)

A phase difference film was adhered to the adjacent layer 1 side of the laminate 1 via a pressure-sensitive adhesive SK2057 (manufactured by Soken Chemical & Engineering Co., Ltd.) so that the cellulose acylate film 1 of the phase difference film and the adjacent layer 1 of the laminate 1 faced each other. In addition, the adhesive layer formed from the pressure-sensitive adhesive corresponds to the optical functional layer.

Next, the antireflection film was adhered to the TAC base material side of the laminate 1 via a pressure-sensitive adhesive SK2057 (manufactured by Soken Chemical & Engineering Co., Ltd.) so that the TAC base material in the antireflection film and the TAC base material in the laminate 1 adhered to the phase difference film faced each other, thereby manufacturing a circularly polarizing plate 1.

GALAXY S4 manufactured by SAMSUNG, having an organic EL panel (organic EL display element) installed therein, was disintegrated, the touch panel to which the circularly polarizing plate was adhered was peeled from the organic EL display device, the circularly polarizing plate was further peeled from the touch panel, and the organic EL display element, the touch panel, and the circularly polarizing plate were each isolated. Subsequently, the isolated touch panel was adhered again to the organic EL display element, and the circularly polarizing plate manufactured above was further adhered to the touch panel via a pressure-sensitive adhesive SK2057 (manufactured by Soken Chemical & Engineering Co., Ltd.) so that the phase difference film became the panel side, thereby manufacturing an organic EL display device 1.

Example 2

An organic EL display device 2 was manufacture according to the same procedure as in Example 1, except that the curable composition 2 was used instead of the curable composition 1 and the bar number was adjusted so that the film thickness became a film thickness described in Table 1.

(Preparation of Titanium Dioxide Fine Particle Dispersion Liquid)

As the titanium dioxide fine particles, titanium dioxide fine particles "MPT-129C" containing cobalt and subjected to a surface treatment using aluminum hydroxide and zirconium hydroxide {manufactured by Ishihara Sangyo Co., Ltd., $TiO_2:Co_3O_4:Al_2O_3):ZrO_2=90.5:3.0:4.0:0.5$ in a mass ratio} was used.

The particles (257.1 parts by mass), the following dispersant (41.1 parts by mass), and cyclohexanone (701.8 parts by mass) were mixed and dispersed by DYNO-MIL to prepare a titanium dioxide dispersion liquid having a mass-average diameter of 70 nm.

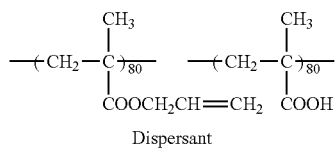

Dispersant

| Curable composition 2 | |
| --- | --- |
| Titanium dioxide dispersion liquid | 193.5 parts by mass |
| DPHA (manufactured by Nippon Kayaku Co., Ltd.) | 60.9 parts by mass |
| Polymerization initiator IRGACURE 907 (manufactured by BASF) | 3.5 parts by mass |
| Photosensitizer KAYACURE DETX (manufactured by Nippon Kayaku Co., Ltd.) | 0.3 parts by mass |
| Methyl ethyl ketone | 146.3 parts by mass |
| Cyclohexanone | 609.6 parts by mass |

Example 3

An organic EL display device 3 was manufactured according to the same procedure as in Example 1, except that the adjacent layer 3 was formed instead of the adjacent layer 1.

(Manufacture of Adjacent Layer 3)

To the photo-alignment material E-1 (0.5 parts by mass) were added DENACOL ACRYLATE DA-212 manufactured by Nagase ChemteX Corporation (0.5 parts by mass), butoxyethanol (41.6 parts by mass), dipropylene glycol monomethyl (41.6 parts by mass), and pure water (15.8 parts by mass), and the obtained solution was pressure-filtered through a 0.45-μm membrane filter. The obtained composition was applied onto the polarizer manufactured in Example 1 and dried at 60° C. for 1 minute. The obtained applied coating film was irradiated with linear polarized ultraviolet rays (an illuminance of 4.5 mW, an irradiation dose of 500 mJ/cm$^2$) using a polarized ultraviolet exposure device to manufacture an adjacent layer 3.

Examples 4 to 7

Organic EL display devices 4 to 7 were manufactured according to the same procedure as in Example 1, except that adjacent layers 4 to 7 were manufactured by adjusting the solid content and the bar count of the curable composition 1 so that the film thickness of the adjacent layer was as described in Table 1.

Example 8

An organic EL display device 8 was manufactured according to the same procedure as in Example 1, except that a phase difference film was adhered using a photocurable adhesive liquid which will be described below instead of adhering using a pressure-sensitive adhesive SK2057 (manufactured by Soken Chemical & Engineering Co., Ltd.).

(Preparation of Photocurable Adhesive Liquid)

3,4-Epoxycyclohexylmethyl-3,4-epoxycyclohexane carboxylate (70 parts by mass), 1,4-butanediol diglycidyl ether (15 parts by mass), and 3-hydroxymethyl-3-ethyloxetane (15 parts by mass) were mixed, and a 50% propylene carbonate solution of a triarylsulfonium salt-based cationic photopolymerization initiator was further mixed therewith at a ratio of 2.25 parts by mass as a solid content, followed by stirring at room temperature for 12 hours, to prepare a photocurable adhesive liquid.

Example 9

A laminate 2 was manufactured according to the same procedure as in Example 1, except that the surface of a TAC base material (TG40, manufactured by FUJIFILM Corporation) having a thickness of 40 μm was not subjected to a saponification treatment in the manufacture of a transparent support 1.

(Manufacture of Circularly Polarizing Plate)

A phase difference film was adhered to the adjacent layer 1 side of the laminate 2 via a pressure-sensitive adhesive SK2057 (manufactured by Soken Chemical & Engineering Co., Ltd.) so that the cellulose acylate film 1 of the phase difference film and the adjacent layer 1 of the laminate 2 face each other.

Next, the TAC base material of the laminate 2 to which the phase difference film was adhered was peeled.

Subsequently, the antireflection film was adhered to the PVA film side of the laminate 2 via a pressure-sensitive adhesive SK2057 (manufactured by Soken Chemical & Engineering Co., Ltd.) so that the TAC base material in the antireflection film and the PVA film in the laminate 2 face each other, thereby manufacturing a circularly polarizing plate 9.

Next, an organic EL display device 9 was manufactured according to the same procedure as in Example 1, except that the circularly polarizing plate 9 was used instead of the circularly polarizing plate 1.

Comparative Example 1

An organic EL display device B1 was manufactured according to the same procedure as in Example 1, except that the curable composition 3 was used instead of the curable composition 1 and the bar number was adjusted so that the film thickness was as described in Table 1.

| Curable composition 3 | |
| --- | --- |
| ADCP(Shin Nakamura Chemical Co., Ltd.) | 99 parts by mass |
| Polymerization initiator IRGACURE 819 | 1 part by mass |

-continued

| Curable composition 3 | |
|---|---|
| (manufactured by BASF) | |
| Methyl ethyl ketone | 45 parts by mass |
| Cyclohexanone | 180 parts by mass |

Comparative Example 2

An organic EL display device B2 was manufactured according to the same procedure as in Example 1, except that the curable composition 4 was used instead of the curable composition 1 and the bar number was adjusted so that the film thickness was as shown in Table 1.

| Curable composition 4 | |
|---|---|
| Titanium dioxide dispersion liquid | 328.3 parts by mass |
| DPHA (manufactured by Nippon Kayaku Co., Ltd.) | 50.7 parts by mass |
| Polymerization initiator IRGACURE 907 (manufactured by BASF) | 3.4 part by mass |
| Photosensitizer KAYACURE DETX (manufactured by Nippon Kayaku Co., Ltd.) | 0.7 part by mass |
| Methyl ethyl ketone | 373.8 parts by mass |
| Cyclohexanone | 824.0 parts by mass |

<Evaluation of Transmittance>

A measurement sample was set on a sample table in a state where a linear polarizer was inserted on the light source side of an optical microscope (trade name "ECLIPSE E600•POL" manufactured by Nikon Corporation). Further, as the measurement sample, a laminate including a TAC base material, a PVA film, an alignment film, and a polarizer, prepared in each of Examples and Comparative Examples was used. This laminate corresponds to a laminate before forming an adjacent layer.

Next, light was irradiated from the TAC base material side, and the following transmittance A and transmittance B of the measurement sample in the wavelength range of 400 to 700 nm were measured using a multi-channel spectrometer (manufactured by OCEAN OPTICS Inc., trade name "QE65000"). Incidentally, a laminate including a TAC base material, a PVA film, and an alignment film, excluding the polarizer from a measurement sample, was used as a reference.

Transmittance A: Transmittance (%) with respect to polarized light in the absorption axis direction of the polarizer Transmittance B: Transmittance (%) with respect to polarized light in the transmission axis direction of the polarizer Incidentally, the transmittance A and the transmittance B each correspond to a transmittance corrected for the visibility without an influence of surface reflection. More specifically, the transmittance A and the transmittance B each correspond to an average transmittance, and the average transmittance was calculated by weighted averaging the transmittance values measured at every 10 nm obtained between 400 and 700 nm by the measurement above, using a Y value of an XYZ color matching function (color matching function of a CIE 1931 standard observer) standardized by International Commission on Illumination (CIE). That is, a calculated value A which is a product of the transmittance value measured at every 10 nm between 400 and 700 nm and the Y value corresponding to the measurement wavelength of the transmittance is calculated for every measurement wavelength, the calculated values A obtained at each measurement wavelength are summed to calculate a total value B, and further, the obtained total value B is divided by a total value C of the Y values used above (the total value B/the total value C) to calculate a transmittance.

<Method for Measuring Refractive Index>

For the measurement of the refractive index of each layer, a layer to be measured was manufactured on a quartz glass plate in order to make the measurement easier, and a refractive index of each layer was measured using a spectroscopic ellipsometer M-2000U manufactured by Woollam Co. Ltd. In a case where a polarizer was provided, an alignment film was formed according to the same procedure as in Example 1, and a polarizer was manufactured on the alignment film. The direction in which the refractive index in the plane is maximized is taken as x-axis, the direction orthogonal to the x-axis in the plane is taken as the y-axis, the normal direction to the plane is taken as the z-axis, and the respective refractive indexes are defined as nx, ny, and nz, respectively. The in-plane average refractive index ($n_{ave}$) is represented by Formula (1).

$$n_{ave}=(n_x+n_y)/2 \qquad \text{Formula (1)}$$

The measured refractive index was adopted as a refractive index at a wavelength of 550 nm.

<Evaluation of Reflectance>

The reflectance of the organic EL display device manufactured in each of Examples and Comparative Examples was measured.

With regard to the reflectance, the Y value in a display system under observation conditions of a viewing angle of 10° and an observation light source ΔD65 using a spectrocolorimeter (manufactured by Konica Minolta Inc.) was taken as a reflectance. The obtained values were evaluated according to the following criteria.

A+: A case where the reflectance is 2.95% or less
A: The reflectance is more than 2.95% and 3.05% or less
A−: The reflectance is more than 3.05% and 3.10% or less
B: The reflectance is more than 3.10% and 3.20% or less
C: The reflectance is more than 3.20%

The "Average" in the "Transmittance" column in the "Polarizer" column in Table 1 indicates an arithmetic average value of the transmittance in the absorption axis direction of the polarizer and the transmittance in the polarization axis direction of the polarizer.

The "Absorption axis direction" in the "Transmittance" column in the "Polarizer" column indicates the transmittance in the absorption axis direction of the polarizer.

The "Absorption axis direction", the "Transmission axis direction", and the "Average" in the "Refractive index" column in the "Polarizer" column indicate the refractive index in the absorption axis direction of the polarizer, the refractive index in the transmission axis direction of the polarizer, and the in-plane average refractive index of the polarizer, respectively.

The "Absorption axis direction", the "Transmission axis direction", and the "Average" in the "Refractive index" column in the "Adjacent layer" column indicate the refractive index of the adjacent layer along the absorption axis direction of the polarizer, the refractive index of the adjacent layer along the transmission axis direction of the polarizer, and the in-plane average refractive index of the adjacent layer, respectively.

In Table 1, the "Average refractive index*film thickness" column indicates a product of the in-plane average refractive index of the adjacent layer shown in the "Average" column and the film thickness shown in the "film thickness" column.

In Table 1, the "Average" in the "refractive index" column in the "adhesive layer" column indicates the in-plane average refractive index of the adhesive layer.

In Table 1, the "Refractive index difference A" indicates a difference between the refractive index in the absorption axis direction of the polarizer and the in-plane average refractive index of the adjacent layer.

In Table 1, the "Refractive index difference B" indicates a difference between the in-plane average refractive index of the adjacent layer and the refractive index in the transmission axis direction of the polarizer.

In Table 1, in the "Whether or not relationship of Formula (Y) is satisfied" column, a case where the relationship of Formula (Y) is satisfied is represented by "A" and a case where the relationship is not satisfied is represented by "B".

As shown in Table 1, desired effects were obtained by using the polarizing plate of the embodiment of the present invention.

Above all, from the comparison of Examples 1 and 3, it was confirmed that in a case where a difference between the refractive index in the absorption axis direction of the polarizer and the in-plane average refractive index of the adjacent layer was 0.15 or less and a difference between the in-plane average refractive index of the adjacent layer and the refractive index in the transmission axis direction of the polarizer was 0.10 or less, the effects were more excellent.

TABLE 1

| | | Type | Example 1 Device 1 | Example 2 Device 2 | Example 3 Device 3 | Example 4 Device 4 | Example 5 Device 5 | Example 6 Device 6 |
|---|---|---|---|---|---|---|---|---|
| Polarizer | Transmittance [%] | Average | 49.0 | 49.0 | 49.0 | 49.0 | 49.0 | 49.0 |
| | | Absorption axis direction | 6.0 | 6.0 | 6.0 | 6.0 | 6.0 | 6.0 |
| | Refractive index | Absorption axis direction | 1.80 | 1.80 | 1.80 | 1.80 | 1.80 | 1.80 |
| | | Transmission axis direction | 1.55 | 1.55 | 1.55 | 1.55 | 1.55 | 1.55 |
| | | Average | 1.68 | 1.68 | 1.68 | 1.68 | 1.68 | 1.68 |
| Adjacent layer | Refractive index | Absorption axis direction | 1.57 | 1.70 | 1.70 | 1.57 | 1.57 | 1.57 |
| | | Transmission axis direction | 1.57 | 1.70 | 1.60 | 1.57 | 1.57 | 1.57 |
| | | Average | 1.57 | 1.70 | 1.65 | 1.57 | 1.57 | 1.57 |
| | Film thickness [nm] | | 700 | 700 | 700 | 60 | 20 | 100 |
| | Average refractive index * film thickness | | 1,099 | 1,190 | 1,155 | 94.2 | 31.4 | 157 |
| Adhesive layer | Refractive index | Average | 1.47 | 1.47 | 1.47 | 1.47 | 1.47 | 1.47 |
| | Film thickness [nm] | | 25,000 | 25,000 | 25,000 | 25,000 | 25,000 | 25,000 |
| Refractive index difference A | | | 0.23 | 0.10 | 0.15 | 0.23 | 0.23 | 0.23 |
| Refractive index difference B | | | 0.02 | 0.15 | 0.10 | 0.02 | 0.02 | 0.02 |
| Whether or not relationship of Formula (Y) is satisfied | | | B | B | B | A | B | B |
| Evaluation of reflectance | | | A 3.05% | A$^-$ 3.10% | A$^+$ 2.95% | A$^+$ 2.85% | A 3.05% | A$^-$ 3.10% |

| | | Type | Example 7 Device 7 | Example 8 Device 8 | Example 9 Device 9 | Comparative Example 1 Device B1 | Comparative Example 2 Device B2 |
|---|---|---|---|---|---|---|---|
| Polarizer | Transmittance [%] | Average | 49.0 | 49.0 | 49.0 | 49.0 | 49.0 |
| | | Absorption axis direction | 6.0 | 6.0 | 6.0 | 6.0 | 6.0 |
| | Refractive index | Absorption axis direction | 1.80 | 1.80 | 1.80 | 1.80 | 1.80 |
| | | Transmission axis direction | 1.55 | 1.55 | 1.55 | 1.55 | 1.55 |
| | | Average | 1.68 | 1.68 | 1.68 | 1.68 | 1.68 |
| Adjacent layer | Refractive index | Absorption axis direction | 1.57 | 1.57 | 1.57 | 1.50 | 1.80 |
| | | Transmission axis direction | 1.57 | 1.57 | 1.57 | 1.50 | 1.80 |
| | | Average | 1.57 | 1.57 | 1.57 | 1.50 | 1.80 |
| | Film thickness [nm] | | 80 | 1,000 | 700 | 700 | 700 |
| | Average refractive index * film thickness | | 126 | 1,570 | 1,099 | 1,050 | 1,260 |
| Adhesive layer | Refractive index | Average | 1.47 | 1.52 | 1.47 | 1.47 | 1.47 |
| | Film thickness [nm] | | 25,000 | 2,000 | 25,000 | 25,000 | 25,000 |
| Refractive index difference A | | | 0.23 | 0.23 | 0.23 | — | — |
| Refractive index difference B | | | 0.02 | 0.02 | 0.02 | — | — |
| Whether or not relationship of Formula (Y) is satisfied | | | A | B | B | — | — |
| Evaluation of reflectance | | | A$^+$ 2.90% | A$^+$ 2.90% | A 3.05% | B 3.15% | C 3.35% |

Furthermore, from the comparison of Examples 4 to 7, it was confirmed that in a case where the relationship of Formula (Y) was satisfied, the effects were more excellent.

In addition, from the comparison of Examples 1 and 8, it was confirmed that in a case where the polarizing plate includes an optical functional layer having an in-plane average refractive index of 1.49 to 1.60, the effects were more excellent.

Explanation of References 10A, 10B: polarizing plate
12, 102: polarizer
14: adjacent layer
16A, 16B: circularly polarizing plate
18, 104: λ/4 plate
20A, 20B, 100: display device
22, 106: display element
24: optical functional layer

What is claimed is:

1. A polarizing plate comprising:
a polarizer; and
an adjacent layer in contact with the polarizer,
wherein a transmittance in an absorption axis direction of the polarizer is 4.0% or more, and
an in-plane average refractive index of the adjacent layer satisfies a relationship of Formula (X), Refractive index in a transmission axis direction of the polarizer<In-plane average refractive index of the adjacent layer<Refractive index in the absorption axis direction of the polarizer.    Formula (X)

2. The polarizing plate according to claim 1,
wherein the polarizer is a polarizer formed using a dichroic substance.

3. The polarizing plate according to claim 1,
wherein a difference between the refractive index in the absorption axis direction of the polarizer and the in-plane average refractive index of the adjacent layer is 0.15 or less, and
a difference between the in-plane average refractive index of the adjacent layer and the refractive index in the transmission axis direction of the polarizer is 0.10 or less.

4. The polarizing plate according to claim 1,
wherein an optical film thickness d, which is a product of the in-plane average refractive index of the adjacent layer and a thickness of the adjacent layer, satisfies a relationship of Formula (Y), $$70+275 \times n \leq d \leq 135+275 \times n,$$    Formula (Y)

in which n represents 0, 1, or 2, and a unit of the thickness of the adjacent layer is nm.

5. The polarizing plate according to claim 1, further comprising:
an optical functional layer in contact with a surface of the adjacent layer opposite to the polarizer side,
wherein an in-plane average refractive index of the optical functional layer is 1.49 to 1.60.

6. The polarizing plate according to claim 1,
wherein the in-plane average refractive index of the adjacent layer is lower than an in-plane average refractive index of the polarizer.

7. The polarizing plate according to claim 1,
wherein an average value of the transmittance in the absorption axis direction of the polarizer and the transmittance in the transmission axis direction of the polarizer is 47.0% or more.

8. A circularly polarizing plate comprising:
the polarizing plate according to claim 1; and
a λ/4 plate,
wherein the adjacent layer is disposed between the polarizer and the λ/4 plate.

9. A display device comprising:
a display element; and
the circularly polarizing plate according to claim 8 disposed on the display element.

10. The display device according to claim 9,
wherein the display element is an organic electroluminescent display element.

11. The polarizing plate according to claim 2,
wherein a difference between the refractive index in the absorption axis direction of the polarizer and the in-plane average refractive index of the adjacent layer is 0.15 or less, and
a difference between the in-plane average refractive index of the adjacent layer and the refractive index in the transmission axis direction of the polarizer is 0.10 or less.

12. The polarizing plate according to claim 2,
wherein an optical film thickness d, which is a product of the in-plane average refractive index of the adjacent layer and a thickness of the adjacent layer, satisfies a relationship of Formula (Y), $$70+275 \times n \leq d \leq 135+275 \times n,$$    Formula (Y)

in which n represents 0, 1, or 2, and a unit of the thickness of the adjacent layer is nm.

13. The polarizing plate according to claim 2, further comprising:
an optical functional layer in contact with a surface of the adjacent layer opposite to the polarizer side,
wherein an in-plane average refractive index of the optical functional layer is 1.49 to 1.60.

14. The polarizing plate according to claim 2,
wherein the in-plane average refractive index of the adjacent layer is lower than an in-plane average refractive index of the polarizer.

15. The polarizing plate according to claim 2,
wherein an average value of the transmittance in the absorption axis direction of the polarizer and the transmittance in the transmission axis direction of the polarizer is 47.0% or more.

16. A circularly polarizing plate comprising:
the polarizing plate according to claim 2; and
a λ/4 plate,
wherein the adjacent layer is disposed between the polarizer and the λ/4 plate.

17. A display device comprising:
a display element; and
the circularly polarizing plate according to claim 16 disposed on the display element.

18. The display device according to claim 17,
wherein the display element is an organic electroluminescent display element.

19. The polarizing plate according to claim 3,
wherein an optical film thickness d, which is a product of the in-plane average refractive index of the adjacent layer and a thickness of the adjacent layer, satisfies a relationship of Formula (Y), $$70+275 \times n \leq d \leq 135+275 \times n,$$    Formula (Y)

in which n represents 0, 1, or 2, and a unit of the thickness of the adjacent layer is nm.

20. A circularly polarizing plate comprising:
the polarizing plate according to claim 3; and
a λ/4 plate,
wherein the adjacent layer is disposed between the polarizer and the λ/4 plate.

* * * * *